(12) United States Patent
Bruch et al.

(10) Patent No.: US 10,393,817 B2
(45) Date of Patent: Aug. 27, 2019

(54) METHOD FOR DETERMINING A REFERENCE ENERGY PROFILE AND DEVICE FOR FORMING A BATTERY

(71) Applicant: Fraunhofer-Gesellschaft zur Foerderung der angewandten Forschung e.V., Munich (DE)

(72) Inventors: Maximilian Bruch, Efringen-Kirchen (DE); Stephan Lux, Emmendingen (DE); Matthias Vetter, Freiburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 148 days.

(21) Appl. No.: 15/710,520

(22) Filed: Sep. 20, 2017

(65) Prior Publication Data

US 2018/0011143 A1    Jan. 11, 2018

Related U.S. Application Data

(63) Continuation of application No. PCT/EP2016/056470, filed on Mar. 23, 2016.

(30) Foreign Application Priority Data

Mar. 23, 2015 (DE) .......................... 10 2015 205 228

(51) Int. Cl.
*G01N 27/416* (2006.01)
*G01R 31/3835* (2019.01)
(Continued)

(52) U.S. Cl.
CPC ... *G01R 31/3835* (2019.01); *G01R 19/16542* (2013.01); *G01R 31/382* (2019.01);
(Continued)

(58) Field of Classification Search
CPC .............. G01R 31/3835; G01R 31/396; G01R 19/16542; G01R 31/382; G01R 31/392;
(Continued)

(56) References Cited

U.S. PATENT DOCUMENTS

| | | | |
|---|---|---|---|
| 2003/0016023 A1* | 1/2003 | Richter ..................... | G01F 1/06 324/427 |
| 2006/0186859 A1* | 8/2006 | Fujikawa ............. | G01R 31/025 320/134 |

(Continued)

FOREIGN PATENT DOCUMENTS

| | | |
|---|---|---|
| CN | 102315417 A | 1/2012 |
| DE | 3736069 A1 | 5/1989 |

(Continued)

OTHER PUBLICATIONS

He, Yan-Bing et al., "Effects of current densities on the formation of LiCo)2/graphite lithium ion battery", J Solid State Electrochem (2011) 15:1977-1985, Oct. 27, 2010, 1977-1985.

(Continued)

*Primary Examiner* — Giovanni Astacio-Oquendo
*Assistant Examiner* — Raul J Rios Russo
(74) *Attorney, Agent, or Firm* — Perkins Coie LLP; Michael A. Glenn

(57) ABSTRACT

A method for determining a reference energy profile has comparing a first course and a second course. The first course describes an energy absorption of a first battery during a first charge cycle. The second course describes the energy absorption of the first or a second battery during a second charge cycle which follows after the first charge cycle. The comparison is performed for a plurality of time intervals. The method has determining a deviation between the first and the second course for each of the plurality of time intervals. In addition, the method has determining an (Continued)

amount of electrical energy based on the deviation for each of the time intervals, wherein the amount of electrical energy describes a preset default value of the reference energy profile for an amount of energy to be fed to a battery to be formed during a formation process of the battery to be formed for each of the time intervals.

78 Claims, 15 Drawing Sheets

(51) Int. Cl.
*G01R 31/396* (2019.01)
*G01R 19/165* (2006.01)
*G01R 31/382* (2019.01)
*G01R 31/392* (2019.01)
*H01M 10/44* (2006.01)

(52) U.S. Cl.
CPC ......... *G01R 31/392* (2019.01); *G01R 31/396* (2019.01); *H01M 10/441* (2013.01); *H01M 10/443* (2013.01); *H01M 10/446* (2013.01); *H01M 10/448* (2013.01)

(58) Field of Classification Search
CPC ... G01R 31/3842; G01R 31/385; G01R 35/00
USPC .................................................. 324/425–437
See application file for complete search history.

(56) References Cited

U.S. PATENT DOCUMENTS

| | | |
|---|---|---|
| 2011/0236751 A1 | 9/2011 | Amiruddin et al. |
| 2012/0047725 A1 | 3/2012 | Gschweitl et al. |
| 2012/0153902 A1 | 6/2012 | Yebka et al. |
| 2014/0002031 A1 | 1/2014 | Chaturvedi et al. |
| 2014/0045030 A1 | 2/2014 | Schaefer et al. |
| 2014/0139230 A1 | 5/2014 | Unterrieder et al. |
| 2014/0159674 A1 | 6/2014 | Genies et al. |
| 2015/0060290 A1 | 3/2015 | Xu |
| 2015/0228999 A1 | 8/2015 | Schaefer et al. |
| 2016/0214500 A1* | 7/2016 | Kim ........................ B60L 58/12 |

FOREIGN PATENT DOCUMENTS

| | | |
|---|---|---|
| DE | 69321490 T2 | 4/1999 |
| DE | 102009035466 A1 | 2/2011 |
| DE | 102012015575 A1 | 2/2014 |
| DE | 102012214119 A1 | 2/2014 |
| DE | 102012214097 A1 | 3/2014 |
| DE | 102012111086 A1 | 5/2014 |
| DE | 102012223566 A1 | 6/2014 |
| EP | 0803957 B1 | 10/1998 |
| EP | 2424069 A2 | 2/2012 |
| JP | 2002208440 A | 7/2002 |
| JP | 2011222358 A | 11/2011 |
| JP | 2014512661 A | 5/2014 |

OTHER PUBLICATIONS

He, Yan-Bing et al., "Effects of Temperature on the Formation of Graphite/LiCoO2 Batteries", Journal of the Electrochemical Society, 155 (7) A481-A487 (2008), May 2, 2008, A481-A487.

Lee, Hsiang-Hwan et al., "A fast formation process for lithium batteries", Journal of Power Sources 134 (2004) 118-123, May 19, 2004, 118-123.

* cited by examiner

100

110 — Comparing a first course which describes an energy absorption of a first battery during a first charge cycle, to a second course which describes the energy absorption of the first or a second battery during a second charge cycle which follows after the first charge cycle, for a plurality of time intervals

120 — Determining a deviation between the first and the second course for each of the plurality of time intervals

130 — Determining an amount of electrical energy based on the deviation for each of the time intervals, wherein the amount of electrical energy describes a preset default value of the reference current profile for an amount of energy to be fed to a battery to be formed during a formation process of the battery to be formed, for each of the time intervals

Comparing a first course which describes an energy absorption of a first battery during a first charge cycle, to a second course which describes the energy absorption of the first or a second battery during a second charge cycle which follows after the first charge cycle, for a plurality of time intervals — 210

Determining a deviation between the first and the second course for each of the plurality of time intervals — 220

Determining that an amount of electrical energy fed to another battery during formation thereof is reduced in a subsequent time interval, based on the comparison when the comparison indicates that an extent of a formation caused by the electrical energy is smaller than or equaling 80% of a formation causable by the electrical energy, wherein a course of the amount of electrical energy over the plurality of time intervals describes the reference current profile at least partly — 230

Fig. 2

METHOD FOR DETERMINING A REFERENCE ENERGY PROFILE AND DEVICE FOR FORMING A BATTERY

CROSS-REFERENCE TO RELATED APPLICATIONS

This application is a continuation of copending International Application No. PCT/EP2016/056470, filed Mar. 23, 2016, which is incorporated herein by reference in its entirety, and additionally claims priority from German Application No. 102015205228.1, filed Mar. 23, 2015, which is also incorporated herein by reference in its entirety.

BACKGROUND OF THE INVENTION

The present invention relates to methods for determining a reference energy profile, to a device for forming a battery, to a method for forming a battery, to a usage of a reference energy profile and to a computer program. Additionally, the present invention relates to a method for an improved formation of galvanic cells or electrical battery cells which form a solid electrolyte interface (SEI), and to an optimized method for guiding a formation current.

Formation is a manufacturing step when producing galvanic cells or electrical battery cells. Formation refers to the first charge and discharge processes where the so-called SEI forms. This process is used for activating the electrochemical processes and/or characteristics of the battery cell. Forming the SEI has a decisive role for important cell characteristics, like internal resistance and cycle stability. A stable uniform layer is of advantage here. Up to now, formation (i.e. charging and discharging) has been realized using very low electrical currents. This in turn results in a time-consuming and, consequently, expensive manufacturing step which may restrict the throughput of the production chain.

Methods known today rely on constant low currents which are to allow a slow uniform SEI formation. A fixed electrical current up to the respective final voltage is set per charge and discharge process. In publications [1] and [2], increasing the current starting from a predefined voltage threshold is suggested, wherein a constant current is applied between the one to three steps. Initially, the smallest possible current intensity (mostly 1/20 C, 1/15 C or 1/10 C) is set, which is based on experience values. With further developed methods, starting from a voltage threshold, the current is increased or formation terminated already, since experiments have shown that after that less SEI is formed and the termination has tolerable negative effects on the cycle stability. Such a procedure is described in [3], for example. A partial acceleration of the method is achieved here by tolerating a slight deterioration of SEI homogeneity or SEI thickness.

FIG. 11 shows a schematic illustration of a concept 90 for forming a battery cell 92 in accordance with the known technology. The battery cell 92 is connected electrically to a direct current source 96 via contactings 94a and 94b. Formation here is done using a constant current I. As is described in [1] and [2], the current I can be controlled by means of a controller 98 such that it is increased in a few predefined steps, wherein a constant current value is set between the steps.

US 2015/0060290 A1 describes a concept where a small current intensity is used up to a predefined point and, after that, a higher, second current intensity is switched to.

DE 3736069 A1 describes applying a regulated current for forming lead-acid batteries. However, when compared to forming galvanic cells, a different electrochemical target is aimed at here. When forming lead-acid batteries, an active layer is set up. Setting up an SEI includes forming an electrically insulating layer between active particles (electrode) and the electrolyte. The electrochemical processes are not comparable.

Consequently, what would be desirable is a concept for forming a battery which, when compared to known methods, allows implementing an improved formation of batteries in a short time and/or obtaining an SEI of high homogeneity.

Consequently, an object underlying the present invention is providing a concept which allows forming a battery in a short time and/or at high an SEI homogeneity.

SUMMARY

According to an embodiment, a method for determining a reference energy profile may have the steps of: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals.

According to another embodiment, a method for determining a reference energy profile may have the steps of: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity; wherein a course of the amount of the electrical quantity over the plurality of time intervals describes the reference energy profile at least partly.

According to another embodiment, a method for forming a battery may have the steps of: obtaining a reference energy profile for forming the battery having: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals; and charging the battery by an amount of an electrical quantity, wherein a temporal course of the amount of the electrical quantity is based on the reference energy profile.

According to still another embodiment, a method for forming a battery may have the steps of: obtaining a reference energy profile for forming the battery having: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity; wherein a course of the amount of the electrical quantity over the plurality of time intervals describes the reference energy profile at least partly; and charging the battery by an amount of an electrical quantity, wherein a temporal course of the amount of the electrical quantity is based on the reference energy profile.

Another embodiment may have a non-transitory digital storage medium having stored thereon a computer program for performing a method for determining a reference energy profile, having the steps of: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals, when said computer program runs on a computer.

Another embodiment may have a non-transitory digital storage medium having stored thereon a computer program for performing a method for determining a reference energy profile, having the steps of: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity; wherein a course of the amount of the electrical quantity over the plurality of time intervals describes the reference energy profile at least partly, when said computer program runs on a computer.

Still another embodiment may have a non-transitory digital storage medium having stored thereon a computer program for performing a method for forming a battery, having the steps of: obtaining a reference energy profile for forming the battery having: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals; and charging the battery by an amount of an electrical quantity, wherein a temporal course of the amount of the electrical quantity is based on the reference energy profile, when said computer program runs on a computer.

Another embodiment may have a non-transitory digital storage medium having stored thereon a computer program for performing a method for forming a battery, having the steps of: obtaining a reference energy profile for forming the battery having: comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals; determining a deviation between the first and the second course for each of the plurality of time intervals; and determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity; wherein a course of the amount of the electrical quantity over the plurality of time intervals describes the reference energy profile at least partly; and charging the battery by an amount of an electrical quantity, wherein a temporal course of the amount of the electrical quantity is based on the reference energy profile, when said computer program runs on a computer.

Another embodiment may have a usage of a reference energy profile having been established using a method for determining a reference energy profile as mentioned above in order to apply the electrical quantity to the battery to be formed based on the reference energy profile.

According to another embodiment, a device for forming a battery may have: a controllable energy source configured to provide an electrical quantity to a battery coupled to the controllable energy source in order to form the battery; control means configured to control the controllable energy source in a plurality of time intervals in order to form the battery during the plurality of time intervals; detection means configured to determine a physical state of the battery in each of the time intervals, wherein the control means is configured to control the controllable energy source based on the physical state detected such that an amount of the electrical quantity provided to the battery during a subsequent time interval is increased or decreased.

According to another embodiment, a method for forming a battery may have the steps of: providing an electrical quantity, by a controllable energy source, to a battery coupled to the controllable energy source in order to form the battery; controlling the controllable energy source in a plurality of time intervals in order to form the battery during the plurality of time intervals; determining a physical state of the battery in each of the time intervals; wherein the controllable energy source is controlled based on the physical state determined such that an amount of the electrical quantity provided to the battery during a subsequent time interval is increased or decreased.

According to another embodiment, a method for determining a reference current profile which has information relating to a current to be provided by a controllable energy source for a formation of a battery to be formed, may have the steps of: comparing a first course which describes a change in voltage with the charge of a first battery during a first charge cycle, to a second course which describes the change in voltage with the charge of the first or a second battery during a second charge cycle which follows after the first charge cycle, for a plurality of time intervals of the courses; determining a deviation between the first and the second course for each of the plurality of time intervals; and determining an electrical current based on the deviation for each of the time intervals, wherein the electrical current describes a preset default value of the reference energy profile for an amount of current to be fed to the battery to be formed by the controllable energy source during a formation process of the battery to be formed for each of the time intervals.

According to another embodiment, a method for correcting a reference energy profile may have the steps of: charging or discharging a battery to be formed with the reference energy profile which has information on a value of an electrical quantity to be provided to the battery; determining a first physical quantity of the battery at a first point in time; interrupting charging or discharging the battery and determining the first physical quantity of the battery at a second point in time which follows after the first point in time; determining a deviation between the first physical quantity at the first point in time and the first physical quantity at the second point in time; correcting the reference energy profile based on the deviation determined; and resuming charging or discharging.

The central idea underlying the present invention is having recognized that the above object can be achieved by the fact that an amount of energy fed to a battery during a formation process can be determined dynamically over a temporal course of the formation process based on observing an actual SEI formation. The amount of energy determined in this way allows highly adapting the formation current intensity to the SEI formation over the temporal course and/or setting the amount of energy such that the SEI is formed homogenously.

A finding of the present invention is that SEI formation may take place non-uniformly while feeding an amount of energy to the battery to be formed. The non-uniformity may result in variable SEI formation rates and/or in a non-uniform layer homogeneity. Adapting the amount of energy to the actual state of the battery to be formed allows accelerating the formation process at least at times and/or forming the SEI at high homogeneity at least at times so that an SEI of high a layer homogeneity can be obtained quickly.

An amount of energy to be fed during the formation can be determined based on a comparison of energy absorption between a first charge cycle and a second charge cycle of the battery. A deviation in energy absorption between the first and the second course in a time interval allows drawing conclusions as to an extent in the SEI which is formed during this time interval so that the amount of energy to be fed to the battery can be adapted dynamically.

Expressed in a simplified manner, the targets described before can be obtained by an adapted, dynamic or varying charging and/or discharging current.

In accordance with an embodiment, a method for determining a reference energy profile comprises comparing a first course which describes an energy absorption of a first battery during a first charge cycle, to a second course which describes the energy absorption of the first or a second battery during a second charge cycle which follows after the first charge cycle. The comparison is performed for a plurality of time intervals. In addition, the method comprises determining a deviation between the first and the second course for each of the plurality of time intervals. Additionally, the method comprises determining an amount of electrical energy based on the deviation for each of the time intervals, wherein the electrical energy describes a preset default value of the reference energy profile for an amount of energy to be fed to a battery to be formed during a formation process of the battery to be formed, for each of the time intervals. By means of forming the previous calculations for determining the reference energy profile, for equal or similar batteries, a reference energy profile can be obtained which allows a high degree of SEI formation in at least one, several or all time intervals, so that a duration until the formation has been terminated, can be short and, consequently, time efficiency of formation can be high. Alternatively or additionally, a uniform SEI formation can be obtained based on adapting the amount of energy fed so that the SEI of high quality is obtained.

In accordance with another embodiment, a method for determining a reference energy profile comprises comparing a first course which describes an energy absorption of a first battery during a first charge cycle, to a second course which describes the energy consumption of the first or second battery during a second charge cycle which follows after the first charge cycle. The comparison is performed for a plurality of time intervals. In addition, the method comprises determining a deviation between the first and the second course for each of the plurality of time intervals. Additionally, the method comprises determining that an amount of electrical energy fed to another battery during formation thereof is reduced in a subsequent time interval, based on the comparison, when the comparison indicates that an extent of formation which is caused by the electrical energy, is smaller than or equaling 80% of a formation causable by the electrical energy. The course of the amount of electrical energy over a plurality of time intervals describes the reference energy profile at least partly. A deviation between the courses may provide a hint to the fact that a portion of more than 20% of the electrical energy is used for charging the battery and, consequently, not for the formation of the SEI. Based on a reduction of the amount of electrical energy fed to the battery to be formed, the portion may be reduced so that a fast SEI and/or an SEI of high quality is formed.

In accordance with another embodiment, a reference energy profile in accordance with previous embodiments is used in order to apply the electrical energy to the battery to be formed in accordance with the reference energy profile.

In accordance with another embodiment, a device for forming a battery comprises a controllable energy source configured to provide electrical energy to a battery coupled to the controllable energy source. The device comprises control means configured to control the controllable energy source in a plurality of time intervals. Additionally, the device comprises detection means configured to determine a physical state of the battery in each of the time intervals. The control means is configured to control the electrical energy source based on the physical state detected such that an amount of electrical energy provided to the battery during a subsequent time interval is increased or decreased. It is of advantage with this embodiment that a variation between individual batteries can be considered based on controlling the electrical energy source based on a current physical state of the battery so that a fast and/or high-quality formation process can be performed for each individual battery.

Further embodiments relate to a computer program and to a method for forming a battery.

BRIEF DESCRIPTION OF THE DRAWINGS

Embodiments of the present invention will be detailed subsequently referring to the appended drawings, in which:

FIG. 1 shows a schematic flowchart of a method for determining a reference energy profile in accordance with an embodiment;

FIG. 2 shows a schematic flowchart of another method for determining a reference energy profile in accordance with an embodiment;

DETAILED DESCRIPTION OF THE INVENTION

Figure 3:
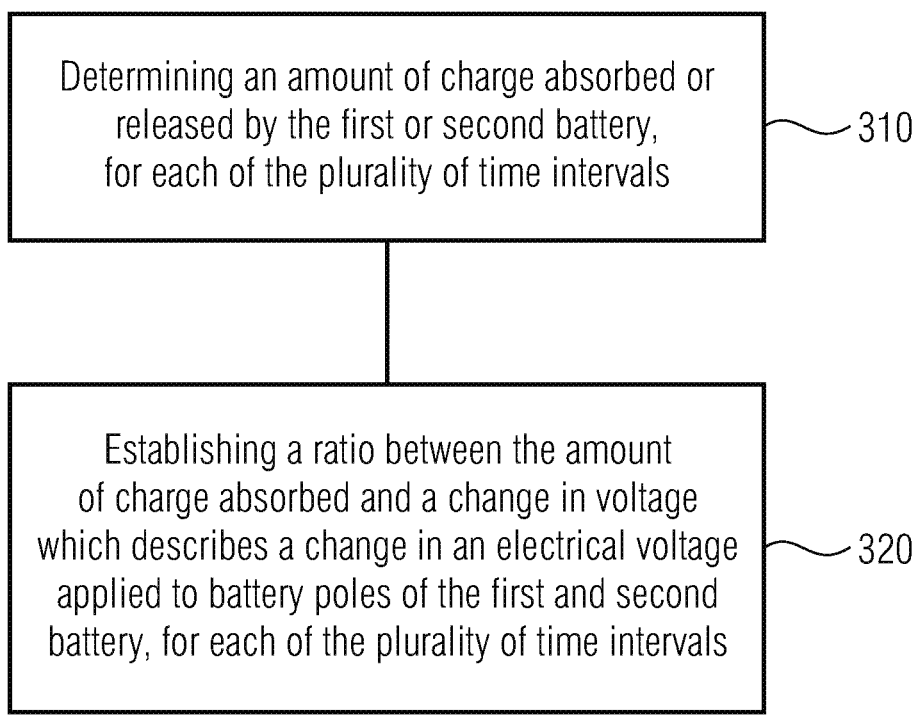
FIG. 3 shows a schematic flowchart of a method for determining an amount of electrical energy in accordance with an embodiment.

Before describing embodiments of the present invention in greater detail below referring to the drawings, it is pointed out that identical elements, objects and/or structures or those of equal function or equal effect are provided with same reference numerals in the different figures so that the description of these elements illustrated in different embodiments may be interchanged or applied among one another.

Embodiments described below partly refer to determining an electrical energy which is fed to a battery for the purpose of formation. Although embodiments refer to determining a course of characteristics or physical states of the battery and/or determining an amount of electrical energy for a charge process of the battery, the discussions below are also applicable to a discharge process of the battery, without any relevant restrictions. During the formation of a battery, a predetermined current intensity may, for example, be applied to the battery. A positive current intensity may result in the battery to be charged, whereas a negative current intensity may result in the battery to be discharged and/or in the battery to be charged negatively, wherein an SEI formation may take place during charging and discharging. Expressed in a simplified manner, the process described below as charging can describe charging or discharging the battery, wherein the process described below as discharging can be understood to be only the complementary process, i.e. discharge process or charge process. An amount of energy fed to a battery as described below may also be negative, for example based on a negative current intensity. This may result in the fact that charge carriers are released from the battery when feeding an amount of energy.

Although the following embodiments refer partly to determining and/or using a reference current profile which comprises information relating to a current to be provided by a controllable energy source, other embodiments relate to determining/or using a reference energy profile which comprises information relating to an electrical energy to be provided to the battery to be formed. This may, for example, also be an amount of charge to be provided and/or an electrical voltage which is provided by a controllable energy source. When, for example, a (shunt) resistance of the device is known, this may be transferred to the current to be fed to the battery to be formed. The reference energy profile may thus comprise information on the electrical energy to be provided. The electrical energy may relate to an electrical current, to an electrical voltage, to an electrical charge and/or to an amount of electrical charge carriers.

FIG. 1 shows a schematic flowchart of a method 100 for determining a reference energy profile (reference current profile) in accordance with an embodiment. The method comprises a step 110 where a first course is compared to a second course. The first course describes an energy absorption (like an increase in charge carriers, decrease in charge carriers and/or a value derived therefrom) of a first battery during a first charge cycle. The second course describes an energy absorption thereof or of another battery during a second charge cycle. The second charge cycle follows after the first charge cycle. The first charge cycle may, for example, be the actually first (initial) charge cycle during which formation of the battery is performed at least partly. The second charge cycle may be a subsequent charge cycle during which the battery is charged again. This means that at least one complementary discharge cycle may occur between the first and the second charge cycle so that the battery can be charged again in the second charge cycle.

The second charge cycle may be the second charge cycle actually following the first discharge cycle or, alternatively, be another (like third, fourth, fifth or further) charge cycle comparable to the first charge cycle. Using the second charge cycle is of advantage since the comparison between the charge cycles here is spaced apart only by a discharge cycle. The comparison is performed for a plurality of time intervals. The plurality of time intervals here may refer to a time span during which formation, i.e. forming the SEI in the battery, takes place. Expressed in a simplified manner, the second course can be associated to an at least partly or completely formed battery and the first course to a battery formed at least to a smaller extent or not at all.

The time intervals may be a time (span) which passes during a time portion of the charge cycle. Alternatively or additionally, the time interval may be a duration during which the first or a second battery comprises a certain physical state or a physical state unchanged within a tolerance range. The physical state may, for example, be a voltage applied (tappable) between poles of the battery. Alternatively or additionally, the physical state may be a current intensity which is absorbed by the battery or released by the same. In addition, the physical state may also be a temperature which the battery is brought to during the formation process, or a temperature which the battery itself has. Alternatively or additionally, it is also conceivable for the physical state to be one or several quantities derived therefrom. For example, this may be a change in voltage between poles of the battery which is related to an absorbed amount of charge. This means that time intervals may, for example, also mean a duration or a point in time during which the battery comprises the respective physical state in an unchanged manner or within a tolerance range. The tolerance range may, for example, be within a deviation of at most 20%, at most 10% or at most 5% of the value of the first or second course.

The method 100 comprises a step 120 where a deviation between the first and the second course is determined for each of the plurality of time intervals. The deviation may be based on a mathematical operation, like calculating a difference, calculating a quotient or the like. Exemplarily, a difference between the energy absorption of the first course in a time interval and an energy absorption of a second course during the same a comparable time interval may be established.

The energy absorption may, for example, relate to a change in voltage dU which is obtained in dependence on an absorbed amount of charge dQ at the battery poles. The course may, for example, be represented using a monotonously increasing battery voltage, as will be discussed below in connection with FIG. 4.

In addition, the method 130 comprises determining an amount of electrical energy based on the deviation for each of the time intervals. The electrical energy describes a preset default value of the reference current profile for an amount of energy to be fed to a battery to be formed during a formation process of the battery to be formed, for each of the time intervals.

Exemplarily, the deviation may relate to a change in voltage occurring per amount of charge between the courses. A large deviation may provide information on the fact that, during the time interval where the deviation between a course associated to an at least partly formed battery and a course associated to a battery formed to a lower extent occurs, a high degree of the energy provided is used for forming the SEI. A small deviation may provide information on the fact that the amount of energy fed or released (charge carriers) results in little SEI formation.

For a time interval for which there are information on a high degree of SEI formed, the reference current profile may contain an instruction on an amount of energy to be fed to the battery to be formed to be low (for example in the form of a small current intensity) so that during this time interval homogenous SEI formation at high a quality can be obtained. For another time interval where the deviation hints at a low SEI formation rate (like a small deviation value), the reference current profile may comprise an instruction of a high current to be provided to the battery to be formed. This may result in this time interval to be passed through quickly. Expressed in a simplified manner, the deviation can be interpreted such that a physical state of the battery where little SEI is formed, is passed through quickly, whereas a physical state where a high degree of SEI is formed, is passed through slowly.

It is of advantage with this embodiment that the reference current profile obtained in this way is able to consider the current state of the battery to be formed, and that an amount of energy to be provided can be determined again for each time interval. In particular, the amount of energy may be increased or decreased between time intervals. The amount of energy may, for example, relate to a current intensity to be provided to the battery to be formed. Alternatively, this may, for example, be an electrical voltage which is output by an energy source and may be fed to the battery as an electrical current via an electrical resistor.

Determining the amount of electrical energy may take place based on a conversion function. The conversion function may comprise at least one function argument which is mapped onto a function value. The function argument may, for example, be the deviation determined. The function value may be the electrical energy or a value correlated therewith. The correlated value may be any value based on which a controllable energy source can be controlled such that it provides a corresponding measure of electrical energy, like a value index, a relative quantity of a current or a voltage or an absolute value thereof. The function value of the conversion function may describe an electrical current intensity or an amount of electrical charge. An exemplary conversion function is discussed referring to FIG. 4 discussed below.

The first battery may, for example, be a reference battery or a battery from a manufacturing batch. In a first case, the first course may be by charging (first charge cycle) the first battery. Subsequently, the first battery can be discharged at least partly and subsequently charged again (second charge cycle) in order to obtain the second course. Alternatively, at least one further charge cycle and/or at least one further discharge cycle may be arranged between the first charge cycle and the second charge cycle.

Alternatively, the second course may be determined based on a charge process of a second battery. The second battery may, for example, comprise at least one equal or comparable characteristic like the first battery. The characteristic may, for example, comprise a shape (like of a battery cell, the electrodes, a volume where an electrolyte is arranged), at least one electrical characteristic (cell size, charge voltage, geometry or the like). In particular, the second battery may, for example, be a battery of identical structure which may even be manufactured in the same manufacturing batch as the first battery.

Alternatively or additionally, it is also conceivable for the first course and/or the second course to each describe a mean value over a plurality (2, 3, 4 or more) of batteries for which the corresponding course is determined. The mean value may be a geometrical, a squared or a median mean value. Calculating a mean value allows high matching of the course of the reference current profile over a plurality of batteries. Alternatively or additionally, the courses may also be formed based on a model and/or a computer simulation, like by reproducing (modeling or simulating) formation of the SEI based on the current intensity applied.

The first course, the second course and/or the reference current profile may be a continuous course, like in the form of overlapping of functions. Alternatively, the first course, the second course and/or the reference current profile may be a plurality of discrete values which allow interpolation or extrapolation of further values.

FIG. 2 shows a schematic flowchart of a method for determining a reference current profile in accordance with an embodiment. The method 200 comprises a step 210. In step 210, a first course which describes an energy absorption of a first battery during a first charge cycle is compared to a second course. The second course describes the energy absorption of the first or a second battery during a second charge cycle which follows after the first charge cycle. The comparison may be performed for a plurality of time intervals. Step 210 may also be step 110.

In step 220, determining a deviation between the first and the second course takes place for each of the plurality of time intervals, as is described for step 120.

In step 230 of the method 200, determining that an amount of electrical energy fed to another battery to be formed during formation thereof is reduced in a subsequent time interval takes place. This may be done based on the comparison. The comparison may, for example, indicate that a degree of formation caused by the electrical energy fed is greater than or equaling 40%, greater than or equaling 60% or greater than or equaling 80% of a formation causable by the electrical energy. A portion may be concluded by, for example, performing measurements on reference batteries (maybe at different time intervals) or performing simulations for a corresponding battery type. A deviation value may be correlated with the portion by means of a conversion function. A course of the amount of electrical energy determined in this way over the plurality of time intervals can describe the reference current profile at least partly. Expressed in a simplified manner, the reference current profile may be obtained by observing the amount of electrical energy determined over the plurality or time intervals.

Known methods are not sufficiently able to consider when SEI formation takes place in which form. Compared to known methods where a current intensity is set to be constant or to be increasing step by step based on predefined criteria, the method 200 allows increasing the amount of energy fed when needed, like when a small degree of SEI is being formed at present, and for accelerating the method. In addition, the method allows reducing the amount of energy when needed. This may, for example, occur when a high measure of the electrical energy, i.e. at least 40%, at least 60% or at least 80% of the electrical energy fed, is transferred to forming the SEI. When charging the battery completely, the SEI may be formed to a higher extent, forming the SEI takes place in a more homogenous state and/or the formation process (charge cycle) takes place in shorter a time.

The first and the second charge cycle may, for example, take place at a constant or predefined (maybe variable) value based on a current intensity applied to the battery. The constant current intensity may comprise any value, like ⅟50 C, ⅟30 C, ⅟10 C or a value between. The value 1 C thus describes a current of the battery indicated in mA, for example. When the battery has a capacity of 2000 mAh, for example, 1 C may correspond to a current intensity of 2000 mA.

The methods 100 and/or 200 may be performed such that a first or second course is associated to a certain charge or discharge process. In addition, the method 100 and/or 200 may be performed repeatedly. A repetition may, for example, be performed such that, in a first repetition (second execution), the first course corresponds basically or completely to the second course of a previous execution. Formation may, for example, comprise two, three, four or five charge and/or discharge cycles. Expressed in a simplified manner, a reference current profile each may be formed and/or used for repeated charge and discharge cycles. A method for forming a battery may be performed repeatedly in at least one repetition. The first course and the second course of a respective execution (first or further execution of the method) may be associated to a charge or discharge cycle of the battery to be formed. The first course or the second course of a repetition may change compared to the first or second course of a previous execution of the method. Exemplarily, charging or discharging a battery may be repeated until the battery has been formed sufficiently, like in a number of 2, 3, 4, 5 or more charge cycles.

FIG. 3 shows a schematic flowchart of a method 300 in accordance with an embodiment. The method 300 may, for example, be used in order to execute comparing the first and second courses, as is illustrated for steps 110 and 210.

The method 300 comprises a step 310. In step 310, an amount of charge absorbed by the first or second battery is determined. The amount of charge is determined for each of the plurality of time intervals.

The method 300 comprises a step 320. In step 320, a ratio between the amount of charge absorbed and a change in voltage which describes a change in an electrical voltage applied to battery poles of the first or second battery is established. The ration is established for each of the plurality of time intervals.

Figure 4:
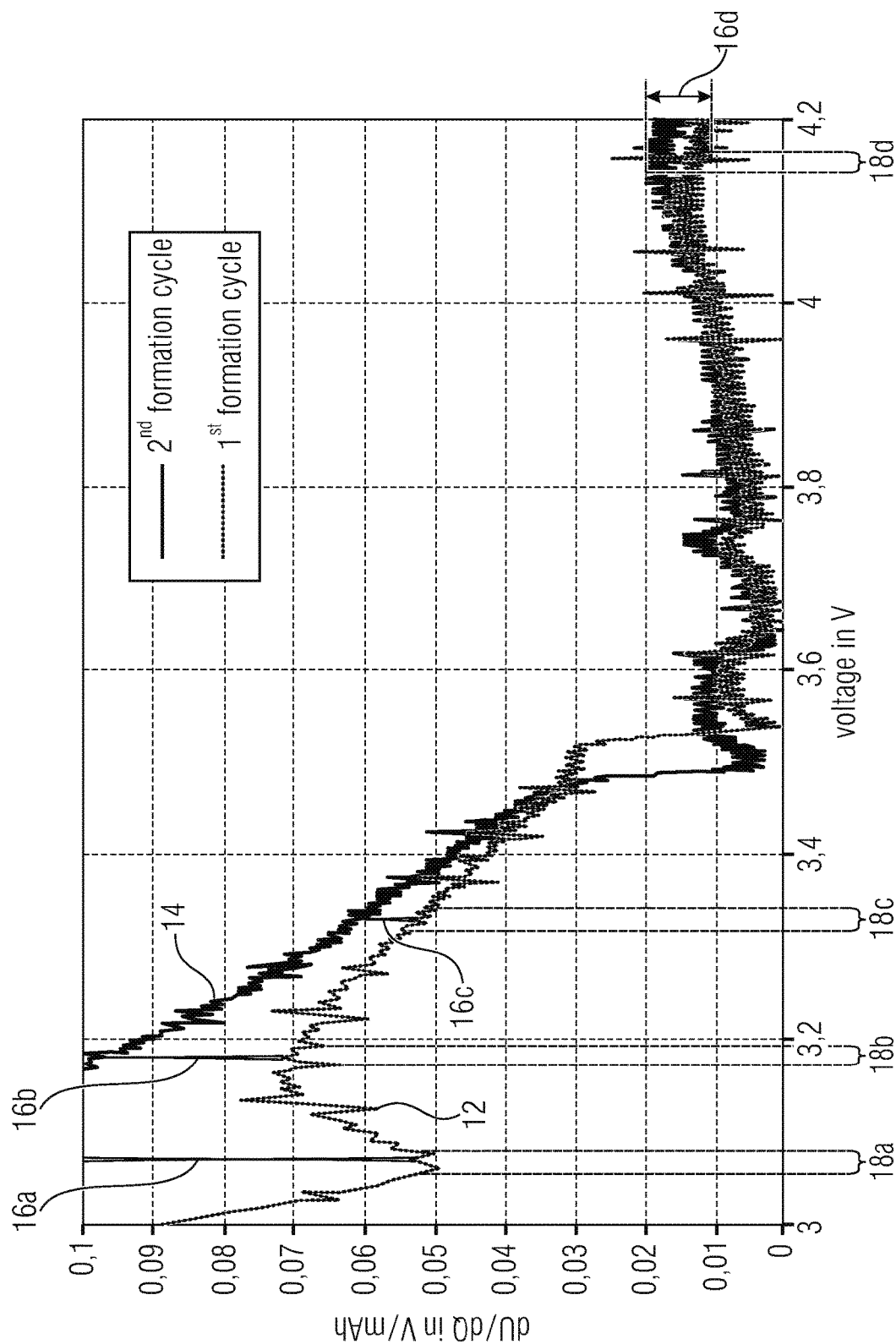
FIG. 4 shows a schematic diagram in which a portion of a first course and a portion of a second course of a charge cycle are represented, in accordance with an embodiment.

FIG. 4 shows a schematic diagram in which a portion of a first course (formation cycle) 12 and a portion of a second course (formation cycle) 14 are illustrated. The courses 12 and 14 exemplarily each describe a charge cycle, wherein the discussion applies to a discharge cycle as well. A monotonously increasing electrical voltage in volts is plotted on the abscissa of the diagram. The electrical voltage may be a physical electrical voltage applied or tappable between a plus pole and a minus pole of a battery. Alternatively or additionally, the electrical voltage may be a simulation result of the physical electrical voltage (like a mathematical value, for example). A voltage gradient $dU/dQ$ is plotted on the ordinate of the diagram, which describes the change $dU$ of the voltage applied on the abscissa in relation to an amount of charge $dQ$ obtained from the respective battery. The voltage gradient can be determined for each of the plurality of time intervals based on an amount of charge determined which is absorbed by the first or second battery. The ordinate exhibits the unit V/mAh. The diagram may, for example, be obtained by applying an electrical current, maybe with a low current intensity, to the battery. This may result in an increase in the voltage (abscissa) wherein the gradient (change or speed of change) is shown on the ordinate. The values indicated on the abscissa and the ordinate are to be understood to be solely exemplary and schematic and are not intended to be of a limiting effect.

The courses 12 and 14 are illustrated in an exemplary operating range of a battery. The operating range exemplarily exhibits a lower limit of roughly 3 volt and an upper limit of roughly 4.2 volts. Different courses may comprise different lower and/or upper limits. Different courses may be determined in at least one region comprising a different lower limit (like roughly 0 volt, 1 volt or another value) and/or a different upper limit (like 2 volts, 3 volts, 5 volts or another value). Exemplarily, at least one of the courses 12 or 14 may also be determined portion by portion, like in a portion outside the operating range (like based on a simulation or reference measurement in a deeply depleted battery) and in a portion within the operating range (like by means of a measurement during the charge process).

The diagram exemplarily comprises four deviations 16a-d between the first course 12 and the second course 14 in four time intervals 18a-d. As has been discussed before, the courses 12 and/or 14 may be subdivided into a plurality of time intervals. Put together, the time intervals may comprise a portion of at least 20%, at least 50% or at least 80% of the charge or discharge cycles, or else comprise same completely. For simplified illustration, only four time intervals 18a-d are represented, wherein the plurality of time intervals (like more than two, more than five or more than 10) may be joined to one another over the courses, maybe seamlessly.

The first deviation 16a is at a voltage of roughly 3.1 V, a second deviation 16b is at a voltage of roughly 3.17 V, a third deviation 16c is at a voltage of roughly 3.3 V, and a fourth deviation 16d is at a voltage of roughly 4.15 V. With a low voltage (deviations 16a and 16b), a charge-specific increase in voltage of the first charge cycle (course 12) is relatively small.

Although the diagram seems to exhibit a high dU/dQ value, in this region, the voltage may increase more strongly due to the battery chemistry, i.e. the normal increase in voltage here is greater. The reference (i.e. the following course) or the battery exhibiting a further formed state, may thus be used as a normal and compared to the current or previous cycle in order to estimate SEI formation (which has the two curves vary).

This means that there is a great difference (deviation 16a). This allows drawing conclusions as to the fact that there is strong SEI formation. This in turn allows determining the amount of electrical energy for a reference current profile (like in step 130) with a low current intensity value.

The deviation values of the deviations 16a-c exemplarily decrease starting from deviation 16a via deviation 16b to deviation 16c. This hints at a decreasing SEI formation. This in turn allows determining the amount of electrical energy such that the reference current profile comprises information on the fact that, in time intervals 18a-c, an increasing amount of energy is to be provided to the battery to be formed.

In regions where the dU/dQ curves (courses 12 and 14) are at least approximately equal (approximately equal within a tolerance range), a deviation may be small. Determining the amount of electrical energy in this case may be performed such that the reference current profile comprises information on a high or maximum current to be provided to the battery in the time intervals.

A length of the time intervals 18a-d may be formed to be as small as desired. Exemplarily, a temporal length of a time interval of the reference current profile may describe a time span where the first course 12 or the second course 14 performs a change of at most 0.01 V, at most 0.05 V or at most 0.21 V. Alternatively or additionally, the duration of a time interval 18a-d may also relate to a time span, or correlate therewith, within which the battery comprises an electrical voltage which is unchanged within a tolerance range of at least 0.01% and at most 30%, of at least 0.05% and at most 10%, or of at least 0.09% and at most 1%, like roughly 0.1%. Alternatively, a length of the time intervals 18a-d may also be obtained based on a temporal duration, like in a range between 10 seconds and three hours, in a range between one minute and one hour or in a range between five minutes and 30 minutes. In particular, it may be of advantage to adapt the amount of electrical energy per hour during the formation process at least three times.

Towards the end of the first charge process (voltage greater than 4.1 V, for example), the dU/dQ value of the first course 12 decreases again when compared to the second charge process (deviation 16d). In this region, the reference current profile may comprise an instruction of providing a reduced current intensity. For each time interval 18a-d, a difference (deviation) in dependence on the voltage may be calculated from the two courses 12 and 14. Alternatively, a quotient comprising a value of the first course 12 and a value of the second course 14 may, for example, be used for determining the deviation. The deviation may, for example, be referred to as $D_{i(U)}$. The same may be converted or mapped to a current profile or a reference current profile $I_{i(U)}$ using a fixed conversion function (f), which may, for example, be represented by $I_{i(U)} = f(D_{i(U)})$. The conversion function f may, for example, be determined such that the current intensity at the beginning ($I_{Start}$) corresponds to a value between 1/50 C and 1/5 C, 1/30 C and 1/10 C, roughly 1/20 C (i.e. between $I_{nen}/50$ and $I_{nen}/10$). This current intensity may, for example, increase linearly, exponentially or with a different association up to equality with a predetermined maximum value, like 1 C ($I_{nen}$). The conversion function may, for example, be represented by $I_{i(U)} = I_{nen} \cdot (1 - (D_{i(U)}/(D1/(1-I_{Start}))))$, wherein D1 may correspond to a value of at least one deviation. The value D1 may be the value of the greatest deviation (like deviation 16a). Alternatively, it may be the respective deviation value of the time interval or a value derived from at least one deviation value). Apart from the voltage, the diagram, or the complete reference method, may also be represented using a time axis (14 or axis of absolute charge ($I_{i(Q)}$) or electrical energy ($I_{i(E)}$), and/or comprise values which are calculated correspondingly.

During the charge or discharge cycle or the formation process, a variable conversion function may also be applied. In a first voltage region of the battery (like outside the operating range), a first conversion function or a constant current of a constant value may, for example, be applied to the battery. In a second voltage region (like within the operating range of the battery), a different conversion function may influence a certain value of the current. Expressed in a simplified manner, the conversion function may be variable over a charge or discharge process.

A voltage which is obtained at poles of the battery and may change during a charge or a discharge cycle, a change in voltage (maybe in dependence on an amount of charge provided to the battery) and/or an amount of charge provided to the battery may exhibit a mutual relation and be transferrable at least with sufficient precision. Different courses, deviations and/or reference energy profiles may thus relate to a voltage, a change in voltage and/or an amount of charge.

Expressed in a simplified manner, an amount of electrical energy may be determined for each of the time intervals based on the deviation. The amount of electrical energy can describe a preset default value of the reference current profile for an amount of energy which is to be fed to a battery to be formed during a formation process. Determining the amount of electrical energy may take place based on a conversion function having at least one function argument (deviation).

As an alternative to deviations 16a-d which are described as a difference, determining the deviation may also include calculating the quotient of a value of the first course 12 and the second course 14.

The reference current profile may, for example, indicate a constant current intensity for a time interval. The time interval may be implemented to be so short that an essentially analog and dynamic change in the current intensity is obtained.

Although the first course 12 and the second course 14 are represented as curves, the first course 12 and/or the second course 14 may be a plurality of values between which the respective course is interpolated or extrapolated. The reference current profile may also be represented as a course, maybe representable as a function, or a plurality of values.

In other words, the dU/dQ diagram illustrates how strongly the voltage has changed in a short time interval dt in relation to the charge introduced or released. Consequently, it can be illustrated where greater a charge is used for a change in voltage. When, for example, the first formation cycle (course 12) is compared to the following second cycle (course 14), it can be determined in which region the first charging or first charge process uses higher a charge for the change in voltage. This additional charge is lost at least partly in side reactions, here, above all, the SEI formation. Thus, the difference (deviation) of the two curve courses at least partly represents the order of magnitude of the SEI formation. Thus, on the one hand, an optimum formation current profile can be established, as described before. Reference formation with a low constant current can be performed. The difference between the dU/dQ curves of two, maybe successive charge and/or discharge processes can be converted to form a current profile using a formula (conversion function).

Figure 5:
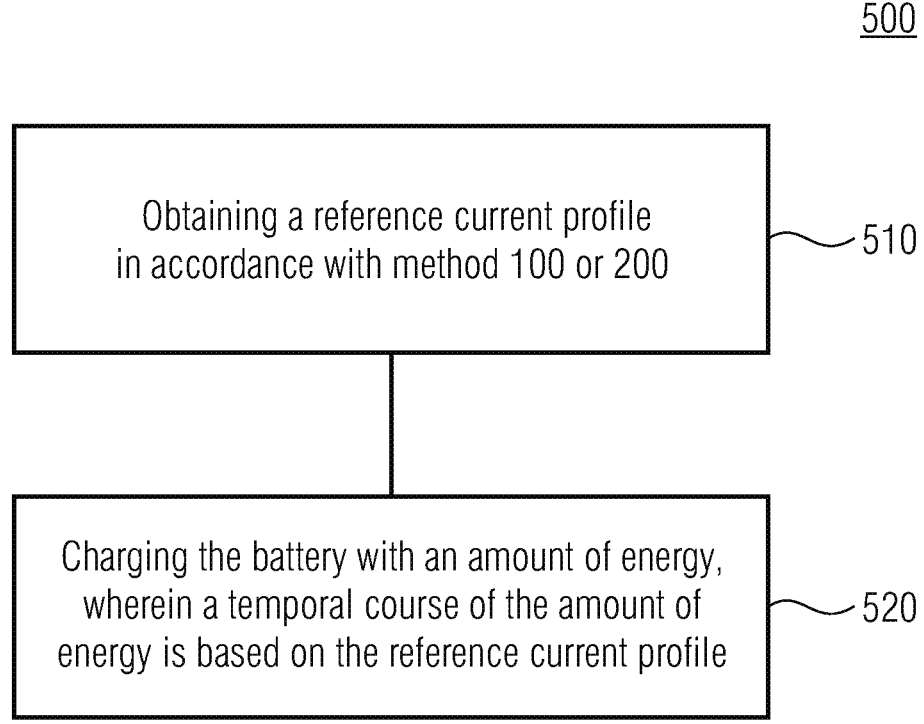
FIG. 5 shows a schematic flowchart of a method for forming a battery in accordance with an embodiment.

FIG. 5 shows a schematic flowchart of a method 500 for forming a battery in accordance with an embodiment. In step 510 of the method 500, a reference current profile is obtained in accordance with method 100 or in accordance with method 200. Obtaining may, for example, take place by means of storing the reference current profile obtained and/or transmitting the same.

In step 520 of the method 500, the battery is charged by an amount of energy. A temporal course of the amount of energy is based on the reference current profile. Expressed in a simplified manner, a controllable energy source can be controlled such that it provides an amount of energy to the battery starting with or in accordance with the reference current profile.

Figure 6:
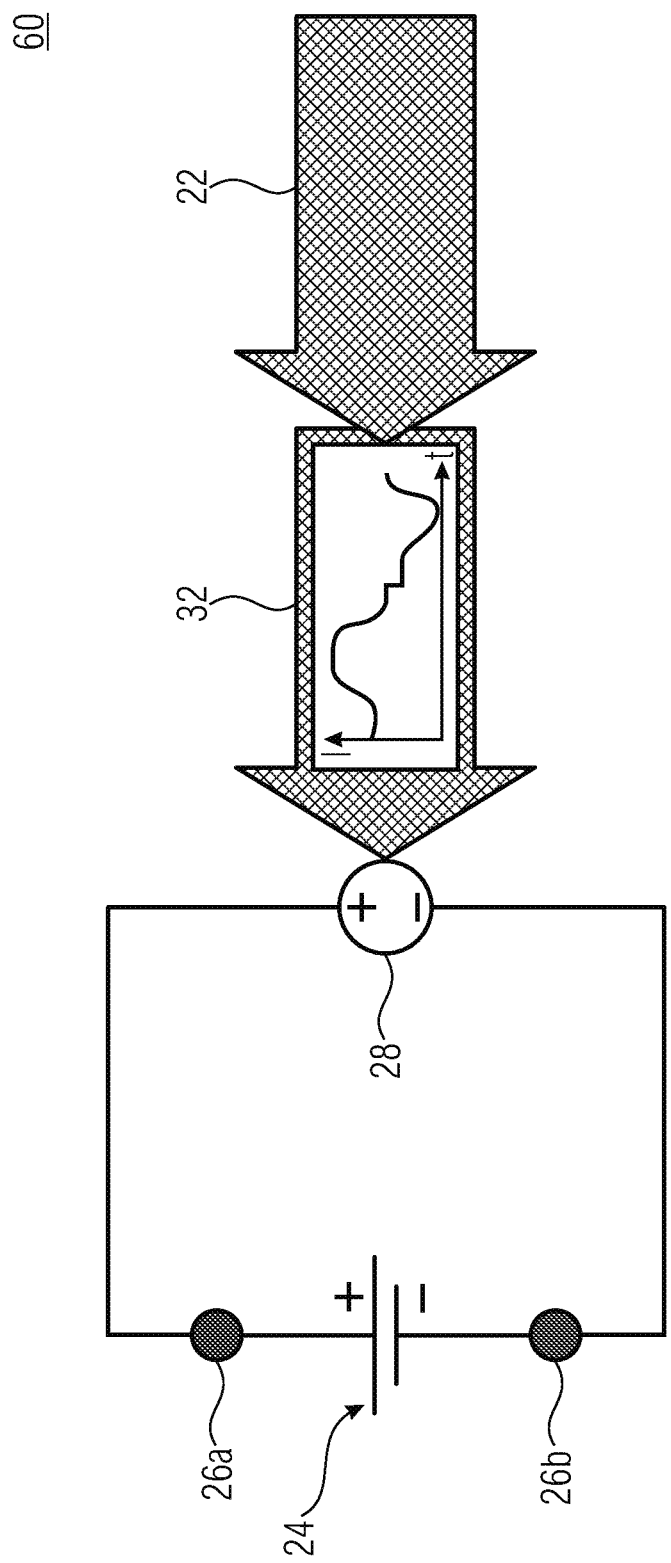
FIG. 6 shows a schematic block circuit diagram of a device for using a reference energy profile in accordance with an embodiment.

FIG. 6 shows a schematic block circuit diagram of a device 60 for using a reference current profile 22 in accordance with an embodiment. The reference current profile 22 has, for example, been established using the method 100 or 200. A controllable energy source 28 coupled to a battery 24 at contact points 26a and 26b is configured to provide the electrical energy to the battery 24 in accordance with the reference current profile. Exemplarily, the reference current profile 22 can be stored in a memory of a control device 32. Alternatively, several reference current profiles may be stored in the memory 22 in order to allow a repeated execution of the formation using a respective adapted reference current profile. The reference current profile is represented with a course of a current I over time t. As described before, the time t may also be understood to be a number of intervals or be described in the reference current profile during which the battery 24 comprises a certain physical state or physical state unchanged within a tolerance range, like a voltage between the battery poles or contact points 26a and 26b, as has been described in connection with FIG. 4.

When, for example, the battery 24 comprises an equal or comparable characteristic as the battery(s) the courses or course of which have been used for determining the reference current profile, using the reference current profile allows an efficient, i.e. fast and/or high-quality SEI formation.

The controllable energy source may, for example, be a controllable current source or a controllable voltage source. In particular, this may be a controllable direct current source. The reference current profile may, for example, be established in dependence on a current intensity, voltage intensity or the amount of charge or energy fed already.

Figure 7:
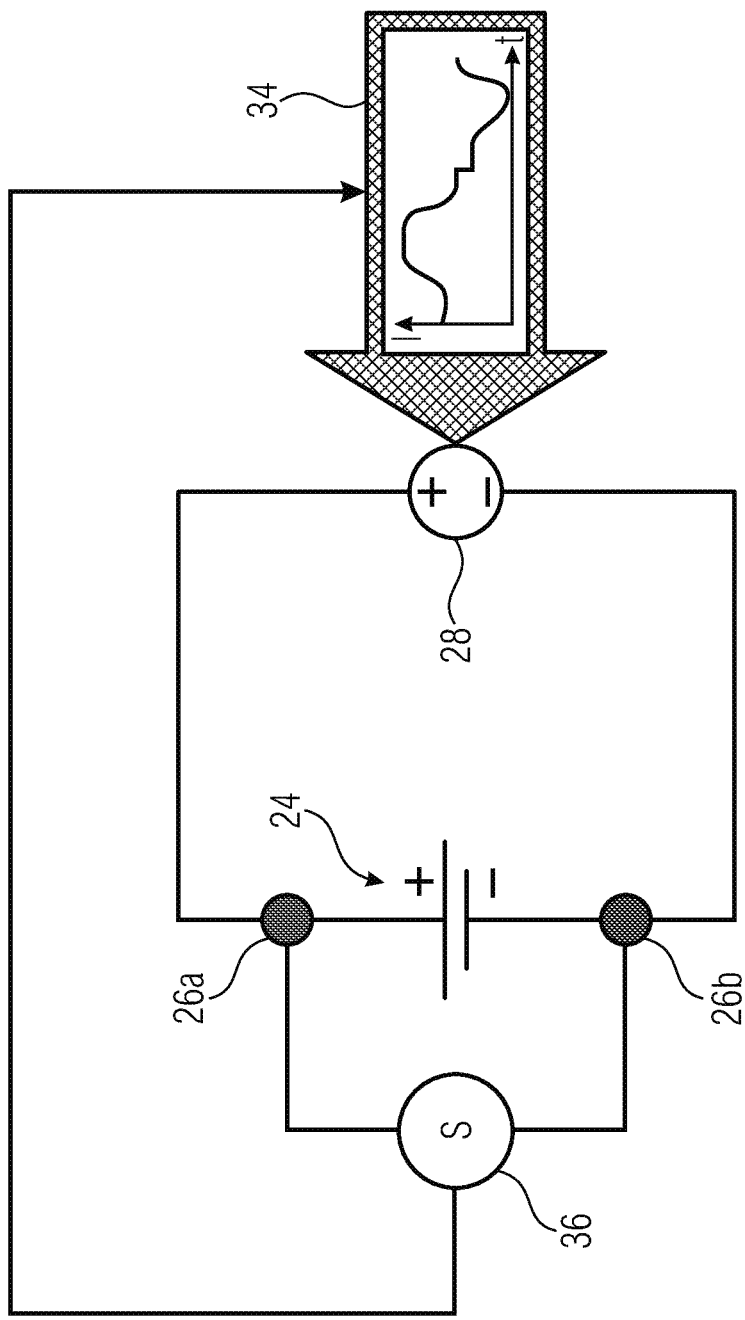
FIG. 7 shows a schematic block circuit diagram of a device for forming the battery in accordance with an embodiment.

FIG. 7 shows a schematic block circuit diagram of a device 70 for forming the battery 24 in accordance with an embodiment. The device 70 comprises the controllable energy source 28 and control means 34. The control means 34 is configured to control the controllable energy source 28 in the plurality of time intervals. The control means 34 may be configured to control the controllable energy source 28 such that a current intensity, a frequency of one or several current pulses or the like is changed dynamically. The device 70 comprises detection means 36 configured to determine a physical state of the battery 24 in at least one, several or each of the time intervals. The control means 34 is configured to control the electrical energy source 28 based on the physical state detected such that an amount of electrical energy provided to the battery 24 during the remaining present or a successive time interval is increased or decreased.

The physical state may exemplarily relate to an electrical voltage applied to battery poles of the battery, to an electrical current intensity fed to the battery 24, an amount of electrical charge absorbed by the battery, a duration during which electrical energy is absorbed by the battery, to a temperature applied to or in the battery and/or values derived therefrom. In particular, the physical state may relate to the voltage gradient described in connection with FIG. 4. Alternatively or additionally, the physical state may also relate to a change in voltage of the electrical voltage applied to battery poles of the battery, in relation to an amount of charge absorbed by the battery (dU/dQ).

Expressed in a simplified manner, values of a reference current profile can be determined at least partly during the formation of the battery 24 based on the physical state detected and/or based on a course detected. For each of the time intervals, the control means 34 is able to control the controllable energy source 28 such that a measure of the electrical energy provided is unchanged, increased or decreased. Exemplarily, an amount of charge may also be reduced based on the determined heating of the battery 24 in order to avoid overheating.

Alternatively or additionally, the control means 34 may be configured to associate a measuring value of the physical state, for example a value provided by the detection means 36 or derived therefrom to an energy quantity. The control means 34 may additionally be configured to control the controllable energy source 28 such that the controllable energy source provides the determined energy quantity of the battery within a subsequent time interval, i.e. a duration following after determining. In particular, the time intervals may be so short (for example roughly one minute) that adapting the amount of electrical energy basically corresponds to a dynamic direct current method.

Exemplarily, the energy quantity may be associated to a certain temperature of the battery 24, to a certain voltage of the battery 24 or to a certain deviation between courses. Exemplarily, the control means 34 may be configured to apply a conversion function to the physical state (function argument) in order to obtain the energy quantity (function value).

In other words, calculating the dU/dQ value may also take place directly when forming the respective cell, instead of determining the current profile before. This may be compared to the second cycle, like the course 14, from the reference formation and the difference be converted to the new formation current. This allows considering the actual state of the cell to an increased extent. A dU/dQ reference may also be established by means of a model and/or simulation.

Figure 8:
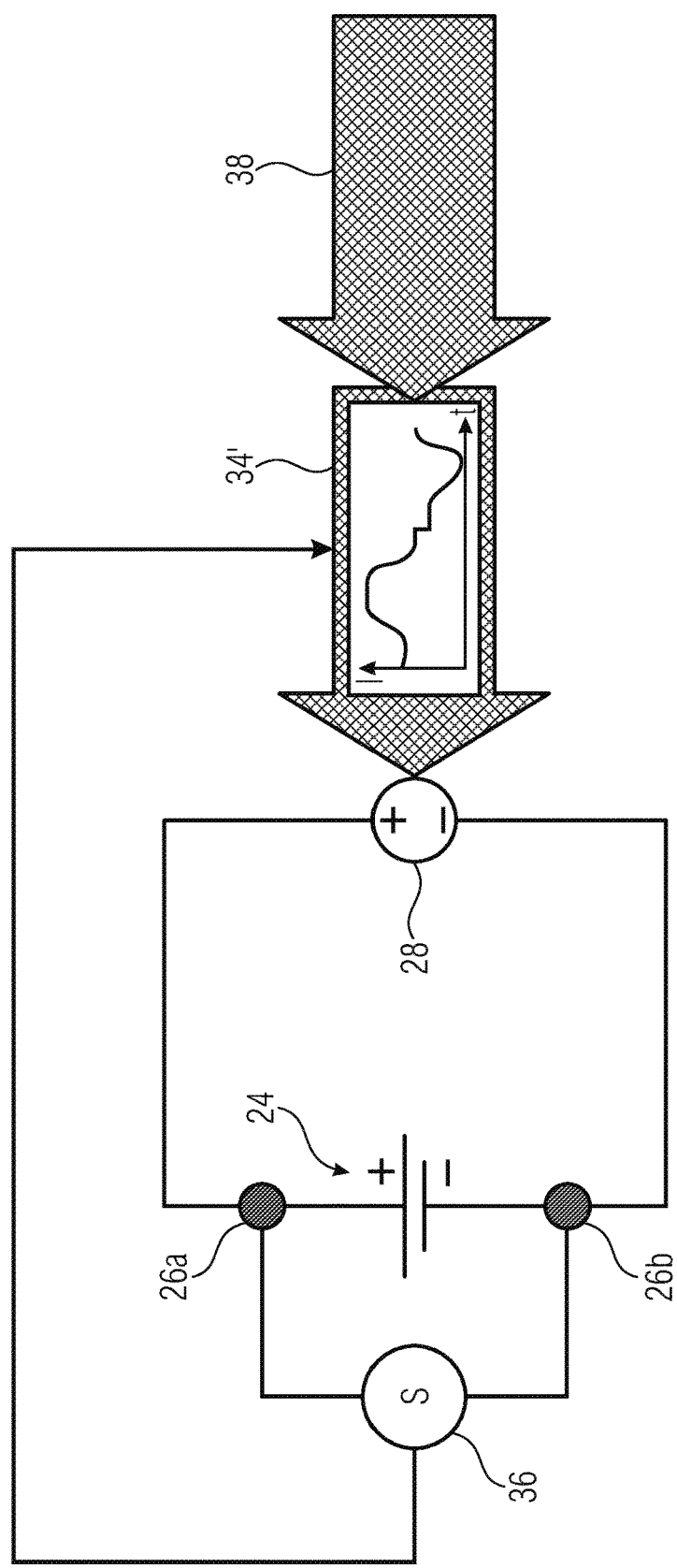
FIG. 8 shows a schematic block circuit diagram of a device which, in contrast to the device of FIG. 7, comprises a memory configured to store a reference energy profile, in accordance with an embodiment.

FIG. 8 shows a schematic block circuit diagram of a device 80 which, compared to the device 70, additionally comprises a memory 38 configured to store a reference current profile and/or a preset default value of a course (like the course 12 or 14) or a physical state. The reference current profile may comprise preset default values for the electrical energy to be provided to the battery and/or the physical state for at least one of the plurality of time intervals of the charge cycle. Control means 34' is, for example, configured to control the controllable energy source 28 based on the reference current profile stored in the memory 38.

Based on a deviation of the reference value for the physical state stored in the reference current profile 38 and the physical state determined by the detection means 36, the control means 34' is, for example, configured to determine, for at least one, several or each of the time intervals, a deviation between the physical state and the preset default value of the physical state. Alternatively or additionally, the course 14 determined beforehand may, for example, be stored in the memory 38. Detecting the voltage of the battery 24 and considering the amount of charge provided to the battery 24 allows obtaining the course 12 during operation (online) so that determining values of the reference current profile and/or determining values of the preset default value of the amount of energy to be provided may take place during operation. This means that at least one of the courses 12 or 14 may be just about to develop. This allows determining the amount of energy at high a precision since the current state of the battery 24 can be considered for determining.

The control means 34' is additionally configured to control the controllable energy source 28, in a manner deviating from the preset default value of the reference current profile such that the battery 24 is charged or discharged with a lower or higher measure of electrical energy when the deviation between the preset default value of the physical state and the physical state detected is greater than, for example, 3%, greater than 5% or greater than 10%.

Alternatively, several reference current profiles may also be stored in the memory 38 in order to allow repeated execution of the formation with a respective adapted reference current profile.

One aspect of embodiments described herein is a way of accelerating formation of the battery to be formed by increasing the amount of electrical energy (current intensity) during at least one time interval, when compared to courses 12 or 14 of a formation using a constant current intensity. While the courses 12 and 14 illustrated in FIG. 4 may comprise a lower or negligible error between an open-circuit voltage and the actual voltage at the battery, based on the lower current intensity, increasing the current intensity may, in some batteries, result in a voltage applied to the battery poles during formation to deviate from an open-circuit voltage. In this context, an open-circuit voltage means a battery voltage in a no-load state thereof and may therefore also be understood to be a no-load voltage. Here, apart from the omission of ohmic effects, capacitor effects and/or diffusion effects subsiding may be waited for, wherein the latter is optional. With an increasing current intensity or an increasing increase in current when compared to a reference energy profile or a constant current intensity matching FIG. 4, a deviation may be increasingly stronger. Thus, with an increasing charge of the battery to be formed, the voltage applied may be higher than the open-circuit voltage or, with an increasing discharge of the battery to be formed, lower than the open-circuit voltage. Open-circuit voltage here is to be understood to be a state of the battery where no load or energy source is connected to the poles of the battery.

Figure 9:
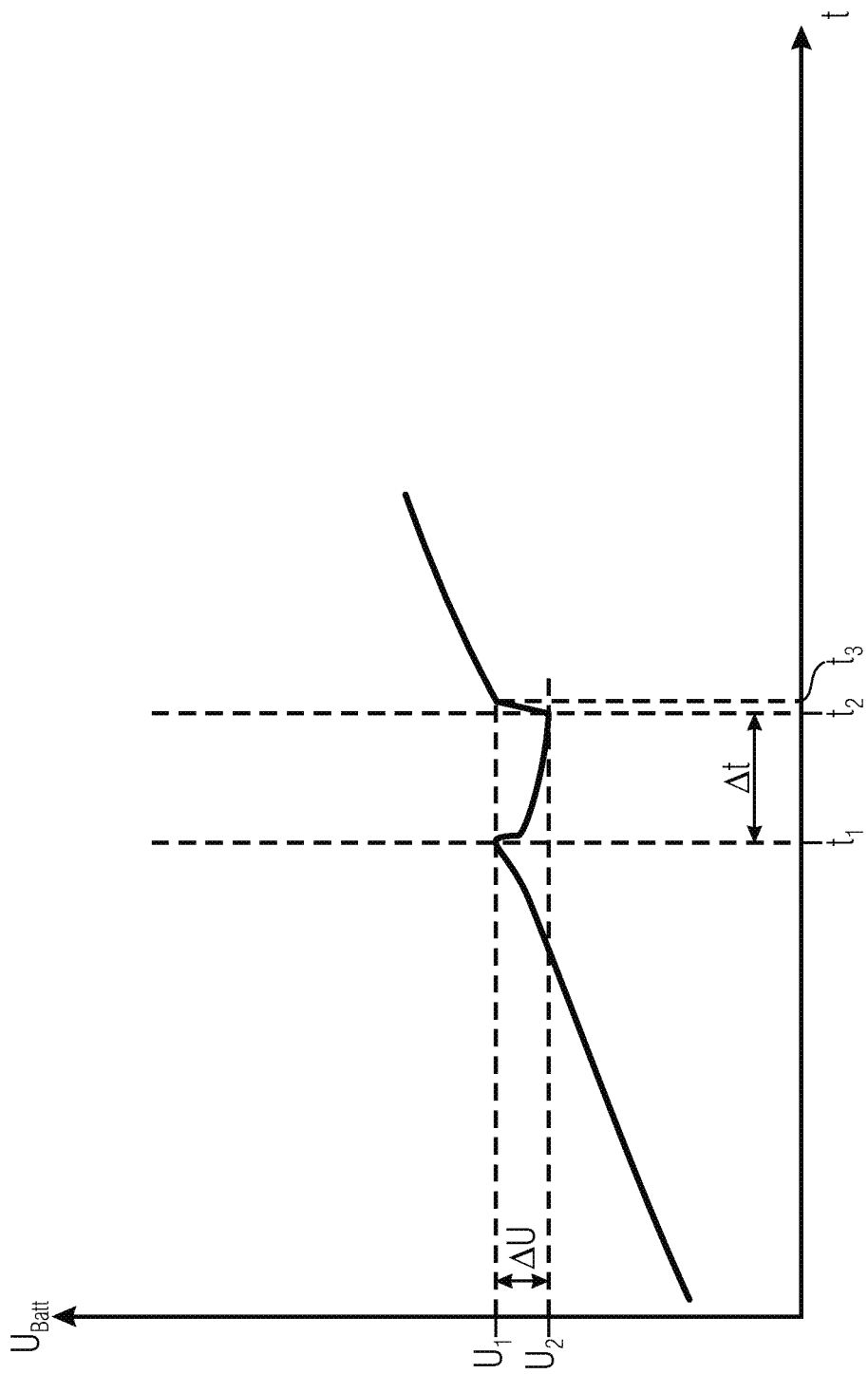
FIG. 9 shows a schematic diagram having a course of a battery voltage during a formation process, as can be obtained in accordance with an aspect of embodiments described herein.

In accordance with an embodiment, the control means 32, 34 and/or 34' of the devices described in FIGS. 6 to 8 is configured to perform correction of the reference energy profile, as is described making reference to FIG. 9 which exemplarily illustrates correction during a charge process, but which may be transferred to a discharge process without any restrictions.

FIG. 9 shows a schematic diagram having a course of a battery voltage during a formation process, as can be obtained in accordance with an aspect of embodiments described herein.

The control device may be configured to interrupt the charging or discharging current feed to the battery at a time $t_1$. The control device is configured to detect a physical quantity, like the potentially erroneous voltage at the battery poles $U_{batt}$. Here, the control device may be configured to detect the physical quantity (voltage) at the time $t_1$ or shortly before the time $t_1$. Exemplarily, the voltage comprises a value $U_1$. Advantageously, the control device detects the voltage $U_{batt}$ shortly, i.e. at most for some seconds or minutes, before or at the time of the interruption. Alternatively, different physical quantities, like amounts of charge carriers, current intensities or the like may be detected via corresponding conversion quantities.

Subsequently, the control device is configured to keep the energy feed or energy drain interrupted for a time interval $\Delta t$, which allows a change in the voltage $U_{batt}$ from the value $U_1$ to the value $U_2$. $U_2$ may be referred to as open-circuit voltage, wherein a length of the interval $\Delta t$ may influence a value of $U_2$, which will be described later.

The control device may be configured to detect again the voltage $U_{batt}$ having the value $U_2$ at a time $t_2$ which follows after the time $t_1$ so that the control device knows a value of the open-circuit voltage. The control device may be configured to compare the open-circuit voltage $U_2$ to the reference energy profile and to determine a deviation $\Delta U$ between the voltage measured $U_1$ which may be used for determining the current intensity applied, and the actual open-circuit voltage $U_2$.

The control device may be configured to connect the energy source to the battery again at a time $t_2$ so that the discharge process or charge process is continued. The control device may be configured to correct the reference energy profile by the deviation $\Delta U$ determined. This may take place such that, when determining the current intensity to be applied, the physical state of battery voltage $U_{batt}$ is corrected by the deviation $\Delta U$ and the current intensity to be applied is selected based on the corrected physical state ($U_{batt}-\Delta U$). As becomes clear from FIG. 9, at a time $t_3$ which follows after the time $t_2$, the battery voltage $U_{batt}$ may be corrupted again due to the energy feed or drain, which may be compensated at least partly by the correction so that efficiency and precision of the formation process are increased despite the waiting time $\Delta t$.

The waiting time $\Delta t$ may be any time interval. Advantageously, a value of a duration of the time interval is in a range between 0.1 s and 600 s. The duration may be selected in dependence on at least a physical effect in the battery to be considered. Thus, mainly ohmic effects in the battery can, for example, be considered by a duration $\Delta t$ in a range of at least 0.1 s and at most 1 s. Longer durations $\Delta t$ of more than 1 s and at most 600 s can additionally consider capacitor effects and/or diffusion effects in the battery.

In accordance with an advantageous further development, the control device is configured to execute the correction based on an auxiliary quantity, like an internal resistance of the battery 24. Here, the control device may be configured to calculate the auxiliary quantity for the battery based on the voltage values $U_1$, $U_2$ and on the amount of energy fed to the battery before the interruption, while using Ohm's laws. The following explanations refer to calculating the auxiliary quantity as the internal resistance of the battery. However, it is pointed out that any other quantity which comprises a combination of the voltage values $U_1$, $U_2$ and the amount of energy may be used, like a conductive value or other mathematical quantities—not common in physics.

The control device may be configured to determine the internal resistance using the deviation $\Delta U$ determined and/or compare the internal resistance to a reference internal resistance. Determining the internal resistance may be executed using Ohm's laws. The internal resistance changes with an increasing SEI formation at the battery. As is discussed in connection with FIG. 4, there may be time intervals during which the voltage at the battery changes relatively strongly by the charge or discharge process and at the same time little SEI is formed, i.e. a small portion of the energy fed is transferred to SEI formation and a high portion to charging the battery. In these portions, the open-circuit voltage thus changes to a higher extent, whereas the internal resistance changes only slightly. Using the internal resistance for correction purposes thus allows a further increase in the precision of the process since it allows drawing conclusions as to the actual state of the battery.

The internal resistance determined may be transferred to a voltage value by which the reference energy profile is corrected, while considering the current fed to the battery after the interruption. When the current is unchanged compared to a value before the interruption, the result may be $\Delta U$. When, however, a changed current is applied, a changed voltage difference $\Delta U'$ may be obtained as the correction value. The voltage value determined may form an offset value by which the reference energy profile is corrected, which may also be understood to be a shift of the reference energy profile by the offset value on the x axis of a diagram, in analogy to FIG. 4, i.e. the current to be applied versus the voltage at the battery poles.

The advantage of the auxiliary quantity will now be explained making use of a theoretical view. If, after the interruption, higher or lower a current were applied to the battery than before the interruption of the energy feed, with a pure usage of the voltage difference $\Delta U$ for the correction, an additional error which is not considered in the determination of the correction value explained before would already be present. If, however, the auxiliary quantity is used, the new, changed current may be combined with the auxiliary quantity and a different voltage difference than before will be obtained as the result. This differing voltage difference may be used as a correction value or offset value and at the same time considers the change in the amount of energy fed.

The reference internal resistance may, for example, also be detected and stored for the control device during the first course 12 and/or second course 14. The control device may be configured to correct the reference energy profile based on the internal resistance determined or a comparison thereof to a reference internal resistance.

A correction making use of the open-circuit voltage may offer sufficient precision, in particular as long as there is no further adaptation of the current. With a further adaptation, the deviation determined between the voltages $U_1$ and $U_2$ may, however, differ from an actual state of the battery, since a current adaptation may also result in a change in the deviation between the actual voltage $U_1$ and the open-circuit voltage $U_2$. This means that increasing the current again may result in an additional error which at this time is still undetermined, which means that the $\Delta U$ determined may be incorrect. This may be recovered by determining the error or correction at every point in time when a current adaptation takes place. Alternatively, the internal resistance may be used advantageously, since the internal resistance is not influenced by a current adaptation, or only to a small extent. The internal resistance determined may thus also be used for future adaptations so that a number of interruptions for determining the internal resistance and, thus, a loss in time due to the correction are small.

The correction described may also be applied in an online method, as has been described in connection with FIG. 8. In this case, the amount of electrical energy may be established during operation. This amount of electrical energy may then be corrected by applying the correction method so that an already corrected value is applied.

A frequency of the measurements of the open-circuit voltage and/or of determining the internal resistance may take place as frequently as desired and, for example, correspond to a frequency in which the deviations 16*a-a* are determined. Alternatively, a measurement of the open-circuit voltage and/or determining the internal resistance may take place only for some of the time intervals, or a measurement of the open-circuit voltage and/or determination of the internal resistance may take place independently of the time intervals.

The deviation determined between the actual open-circuit voltage $U_2$ and the assumed quasi open-circuit voltage of the first or second course may be stored in a memory of the control device as an offset value and be considered for correctional purposes up to a new measurement. Alternatively or additionally, the deviation determined between the actual internal resistance and the assumed quasi internal resistance of the first or second course may be stored in the memory of the control device as an offset value and be considered for correctional purposes up to a new measurement.

In summary, a method for correcting a reference energy profile may comprise the following steps: charging or discharging a battery to be formed with a reference energy profile which comprises information on an electrical quantity to be provided to the battery, like a current, may take place. In addition, determining a first physical quantity of the battery at a first point in time $t_1$ may take place. Interrupting charging or discharging the battery may be performed and determining the first physical quantity of the battery at a second point in time $t_2$ which follows after the first point in time $t_1$ may be executed. The method may comprise determining a deviation between the first physical quantity at the first point in time and the second physical quantity at the second point in time, correcting the reference energy profile based on the deviation determined and resuming charging or discharging.

Advantageous further developments of the method may be implemented such that the reference energy profile comprises information on the electrical quantity to be provided to the battery in dependence on an electrical voltage applied to battery poles of the battery, that the first physical state is the electrical voltage applied to battery poles of the battery, and that correcting the reference energy profile takes place based on the deviation determined.

Further advantageous developments of the method may be implemented such that an auxiliary quantity for the battery is determined based on the deviation and based on the electrical quantity (current) provided to the battery with a first value before the interruption. A correction value for the reference energy profile may be determined based on the auxiliary quantity and based on a second value of the electrical quantity provided to the battery which is applied after resuming. The same may be different from or equal to the first value. The reference energy profile may be corrected based on the correction value determined. This correction may be performed by devices of embodiments described herein independently of or in combination with other methods.

Alternatively or additionally, the advantageous implementations may be executed such that the first physical quantity of the battery 24 at the second point in time $t_2$ is an open-circuit voltage $U_2$ of the battery 24.

Expressed in a simplified manner, the charging or discharging accelerated when compared to the first or second course may result in a deviation of the voltage applied to the battery poles when compared to the open-circuit voltage of the first or second course so that imprecision occurs during the formation when the voltage at the battery poles is equated with the open-circuit voltage. This imprecision may be reduced by making use of the actual open-circuit voltage and may be reduced further when using the internal resistance as the correction parameter.

In other words, the control means 32, 34 and/or 34' may further be configured such that it is able to establish the current internal resistance of the cell connected and correspondingly adapt the reference current profile or reference energy profile. Here, the control means interrupts energy feed or energy drain (alternatively current feed/current drain, alternatively charge process/discharge process) for a short time (0.1 to 600 seconds). The result is a voltage response $(dU_t)$ measurable $(dU_t=U_{directly\ before\ interruption} - U_{t\ seconds\ after\ interruption})$. Using this voltage response, the internal resistance may then be calculated using known calculating rules $(R_t=dU_t/I_{shortly\ before\ interruption})$. Using the internal resistance, the reference current profile may be changed such that it is exemplarily shifted on the x axis by an amount (see FIG. 4) which is calculated from the present current and the internal resistance measured by applying Ohm's laws, which means that the reference profile is corrected as regards the effects of the changing internal resistance.

Figure 10:
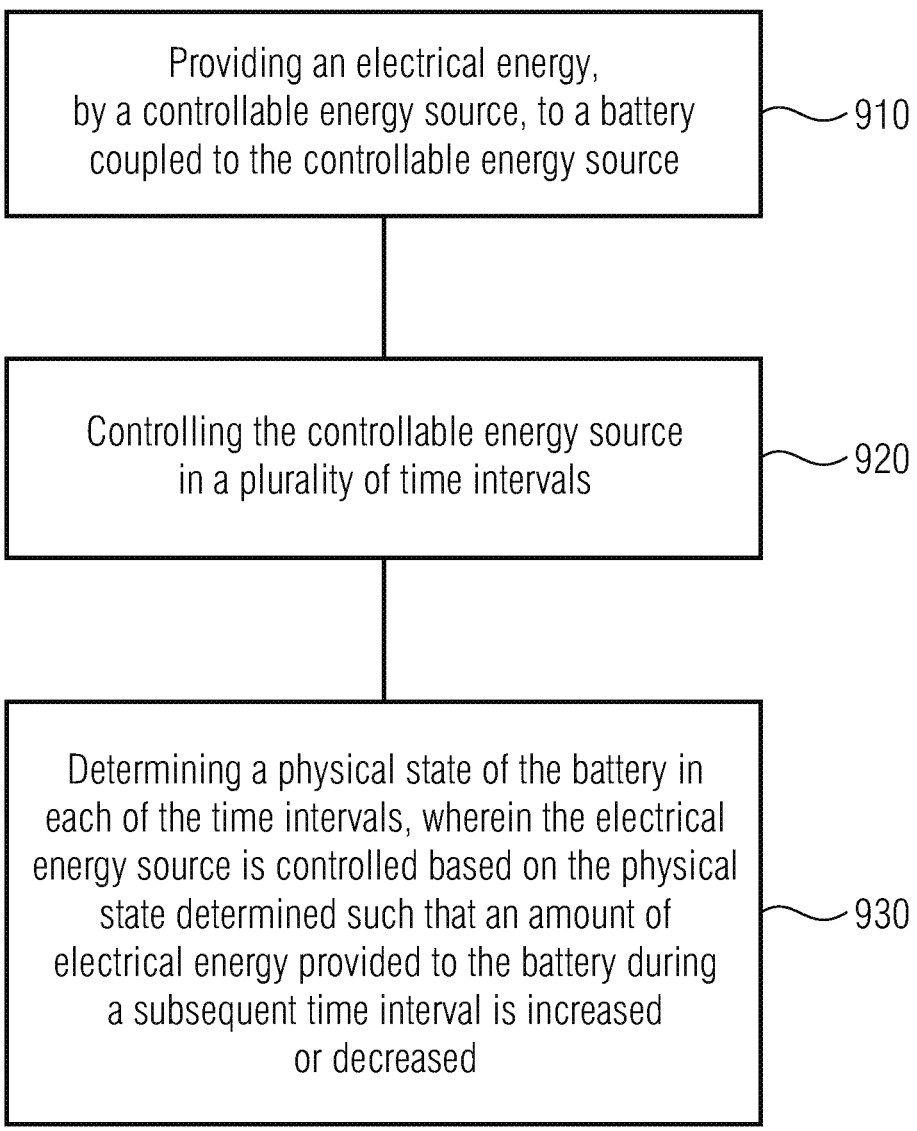
FIG. 10 shows a schematic flowchart of a method for forming a battery in accordance with an embodiment.
Figure 11:
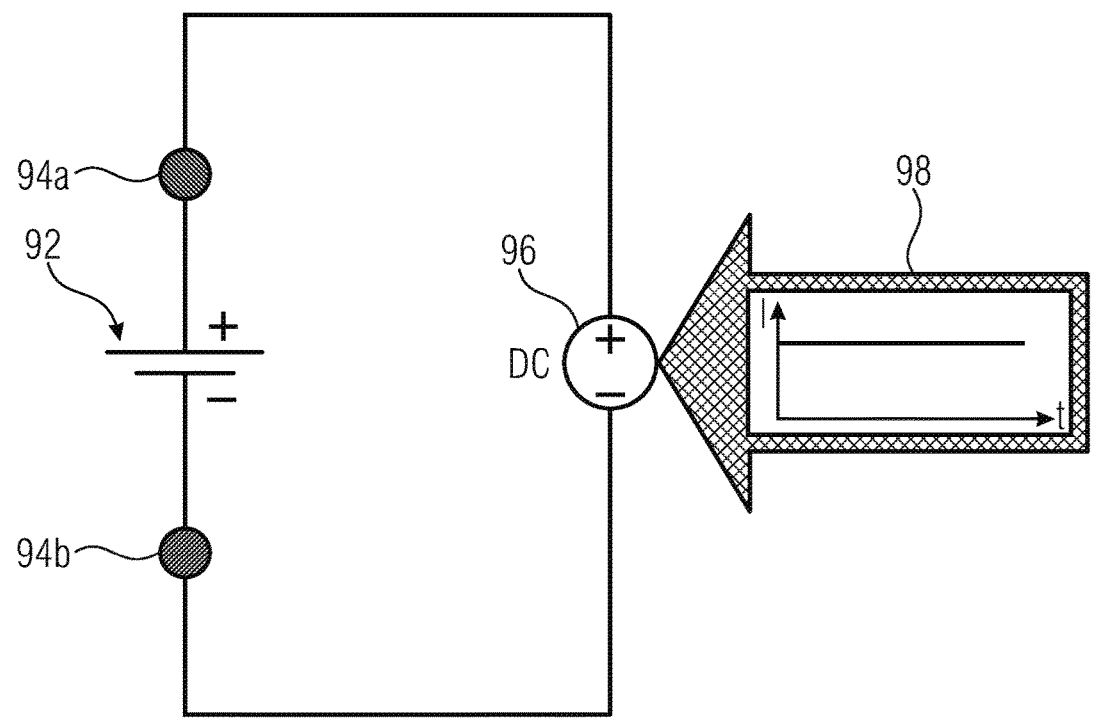
FIG. 11 is a schematic illustration of a concept for forming a battery cell in accordance with the known technology.

FIG. 10 shows a schematic flowchart of a method 900 for forming a battery. The method 900 comprises a step 910 where an electrical energy is provided, by a controllable energy source, to a battery coupled to a controllable energy source. In step 920, the controllable energy source is controlled in a plurality of time intervals. In step 930, a physical state of the battery is determined in each of the time intervals, wherein the electrical energy source is stored based on the physical state determined such that an amount of electrical energy provided to the battery during a subsequent time interval is increased or decreased.

FIGS. 12*a-d* described below schematically discuss the applicability of embodiments described before for establishing a reference energy profile and/or the application thereof. In particular, it is explained how the embodiments described herein work, that are set up, on the basis of a comparison of a regularly or normally formed battery or battery cell to an unformed battery or a battery to be formed the SEI of which has not been formed yet or not sufficiently. The normally formed battery is referred to in the following Figs. by X2 and may be understood to be a formed battery or a battery cell the SEI of which has been formed or formed sufficiently. X1 and X3 each refer to batteries which have not yet been formed or not yet been formed sufficiently. Deriving a reference profile as described below may, for example, be understood to be a comparison between two cells, like the comparison between measuring values described in connection with FIG. 4. Here, a difference of measuring values which refers to a dU/dQ course, i.e. a change in voltage related to an absorbed amount of charge carriers, between different charge and/or discharge processes. A course referred to by Y2 may relate to a standard profile of the normally formed cell X2 which is compared to a course Y1 of an unformed cell X1 or X3. Alternatively, a reference energy profile or reference profile, like a current profile, can be calculated for forming the battery X3, or be obtained by means of a simulation instead of an initial measurement, which is referred to as Y3.

Figure 12A:
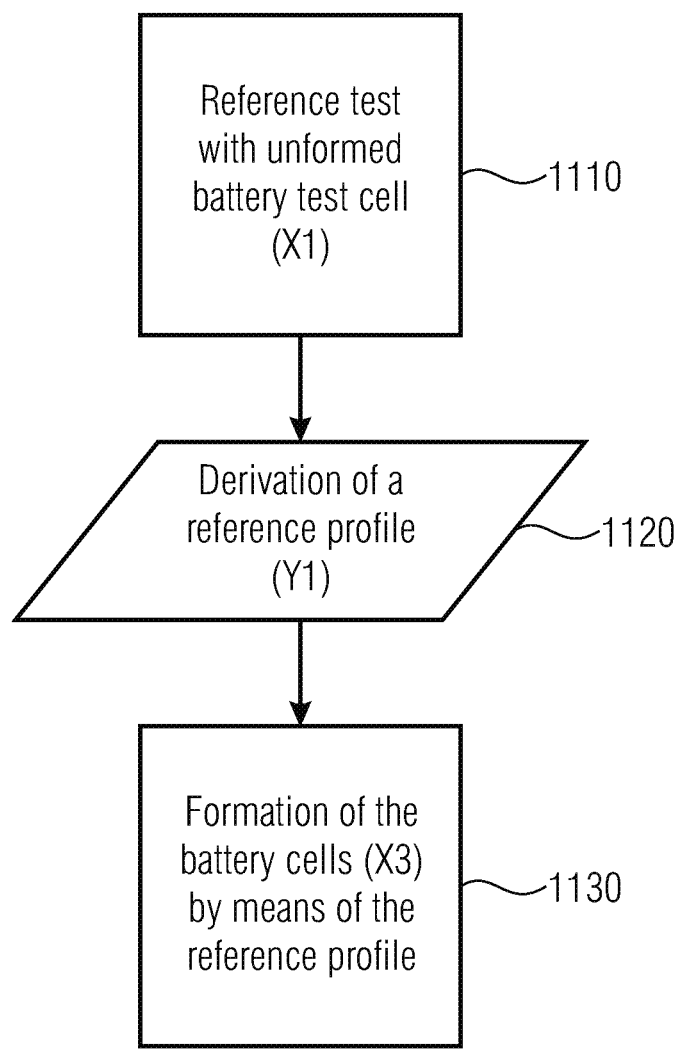
FIGS. 12a-b are schematic illustrations of methods for forming a battery by using a reference energy profile in accordance with embodiments described here.

FIG. 12*a* shows a schematic flowchart of a method 1100 where, in step 1110, a reference test is performed using an unformed battery test cell, i.e. a battery X1. In step 1120, a reference profile Y1 is derived, like by comparing the measuring values obtained in step 1110, to a standard profile Y2. In step 1130, formation of at least one battery cell X3 may take place by means of the reference profile. Step 1110 may, for example, comprise step 110 and/or step 210. Step 1120 may, for example, comprise steps 120, 130 and/or 220. Step 1130 may comprise the method 900.

Figure 12B:
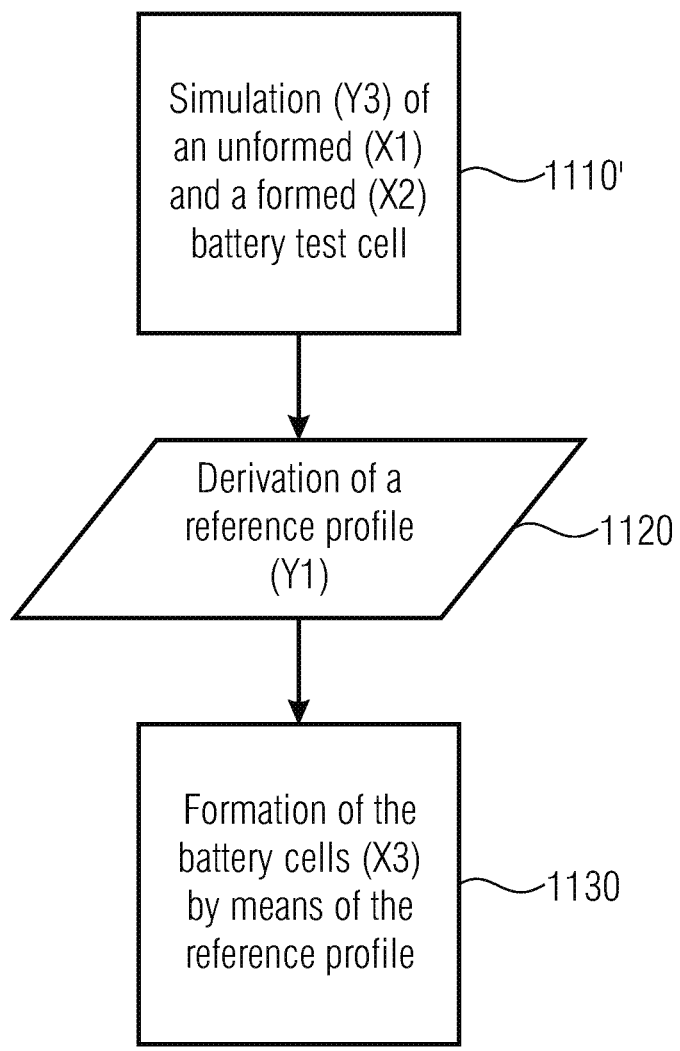

FIG. 12*b* shows a schematic flowchart of a method 1100' modified compared to the method 1100. As an alternative to step 110, the method 1100' comprises step 1110' which may be performed as an alternative to or in addition to step 1110. In step 1110', a simulation (Y3) of an unformed or only partly formed battery cell X1 takes place with a formed battery test cell X2. As has been discussed in connection with embodiments described before, a corresponding simulation may also be performed instead of a test of a battery cell.

Figure 12C:
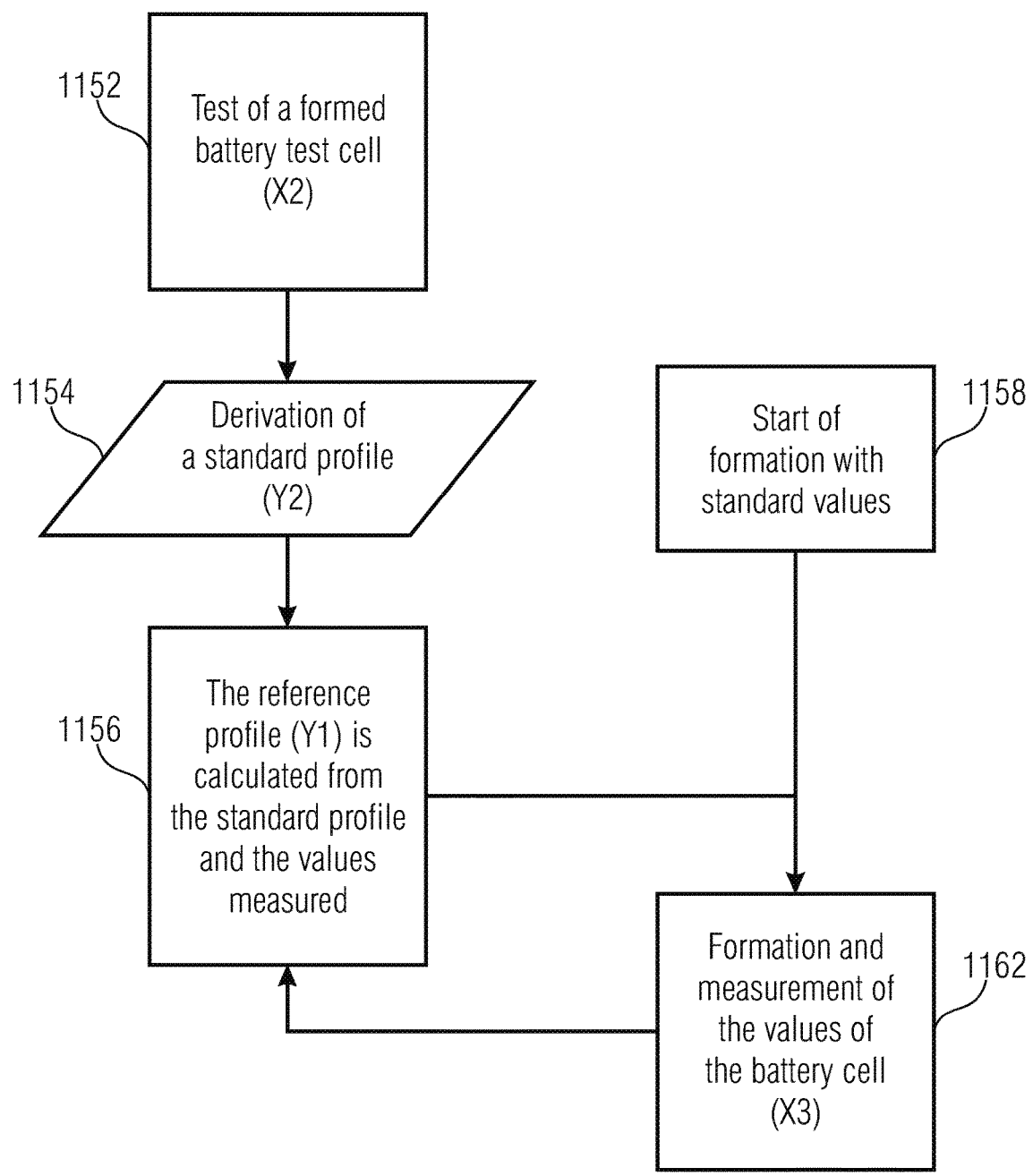
FIGS. 12c-d are schematic illustrations of methods for forming a battery by adapting a standard profile in accordance with embodiments described here.

FIG. 12*c* shows a schematic flowchart of a method 1150 which comprises a step 1152 where an already formed battery test cell X2 is examined. In step 1154, a standard profile Y2 may be derived from this, as is known already. In step 1156, a reference profile Y1 may be obtained from the standard profile obtained in step 1154 and the values measured, which may take place in a type of regulating circuit. Here, in step 1158, starting the formation may take place, for example, with standard values, as is, for example, predetermined by the standard profile. Based on the measuring values detected during the formation, as has been described in connection with FIG. 7. In step 1162, the formation obtained by step 1158 and measuring the values of the battery cell X3, alternatively X1, are illustrated. These measuring values are compared to the standard profile Y2 in step 1156. The standard profile Y2 is adapted based on the comparison in order to obtain the reference profile Y1. This means that the formation characteristic values may be adapted during formation and during operation.

Figure 12D:
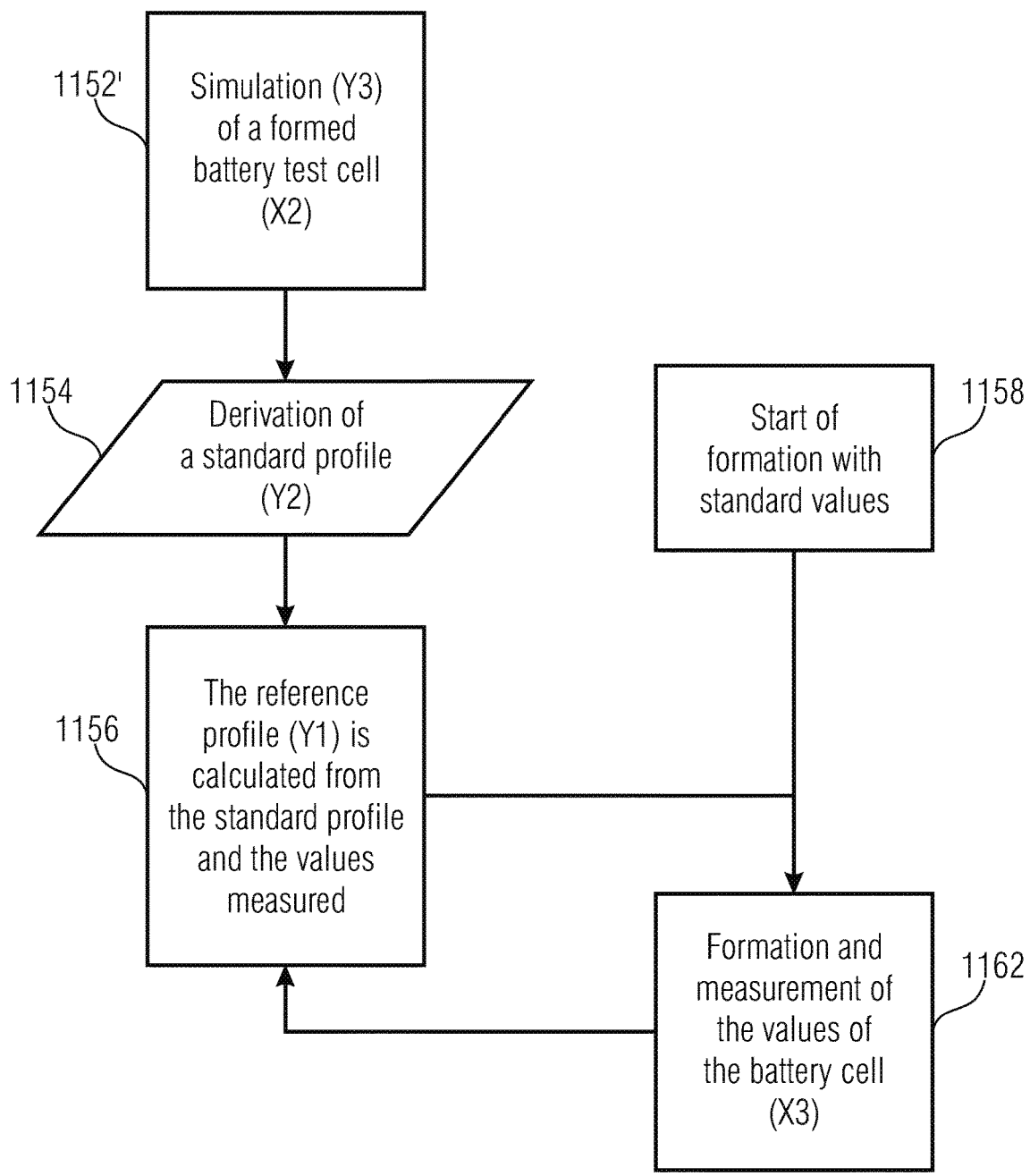

FIG. 12*d* shows a schematic flowchart of a method 1150' for forming a battery. The method 1150', compared to the method 1150, comprises step 1152' which may be performed alternatively or in addition to step 1152 of the method 1150. In step 1152', a simulation Y3 of a formed battery test cell X2 takes place, which means that simulation of the battery formed may take place instead of the test and/or the measurement in step 1152.

In other words, the current intensity may play a decisive role in SEI formation. The current intensity may be of a varyingly strong influence during different stages of formation. In addition, the electrochemical behavior of battery cells may depend on many factors, like cell chemistry, geometry or the like. In accordance with embodiments described before, the electrical current (amount of energy) may be adapted to the current characteristic of the cell in order to obtain an optimum of process speed and product quality. Here, the formation electronics (control means) may regulate the current such that it corresponds to a profile defined before for the cell (reference current profile). Alternatively or additionally, the current may be adapted by different values measured (physical states) of the respective cell. This allows data processing and a new calculation of the amount of energy derived therefrom for each time section. In particular, applying the reference current profile and using the values measured can be combined.

Embodiments described before may be applied in all battery cells which form an SEI on the anode and/or cathode interface during the first charge and discharge processes. In particular, lithium-ion cells having graphite/carbon or silicon anodes are mentioned here.

A dynamic adaptation of the current or the amount of electrical energy here may result in the current intensity to represent the optimum for the cell at every point in time.

Embodiments described before relate to a battery cell to be charged which is connected electrically to a (direct) current source via a contacting. The formation may take place by means of a dynamic current. The electrical current intensity may increase or decrease dynamically at every point of observing. The current intensity may be defined either by a predefined profile. This profile may be established before by a reference measurement or reference formation, or by means of simulation using a model. The reference current profile may establish the current intensity for a certain time or a certain voltage of the battery, wherein additionally the number of cycles and the direction of the current may play a role. The reference current profile may alternatively or additionally also relate to discharging the battery with a fixed current intensity. Expressed in a simplified manner, a discharge process may be described to be the reversal of the current direction so that the mechanisms mentioned above remain effective without any relevant restrictions.

Alternatively, the current may be calculated using signals or values measured by one or several sensors (detection means). Of importance here may be the voltage, time, current intensity, temperature and/or quantities derived therefrom, like the electrical charge. In addition, a system may be realized which is made up of both methods, like the device 80. A profile is, for example, preset, which is revised and/or amended on the basis of values measured.

Embodiments described above allow a considerable acceleration of the formation process with an equal or even improved cycle stability of the battery cell. A temporal and, consequently, economical advantage results from shortening the process. In addition, high a quality (improvement in quality) of the SEI formed may be obtained by embodiments described before.

Embodiments described before may result in a considerable shortening of formation, which may result in a high production throughput of formation apparatuses or devices.

Embodiments described before may be applied when manufacturing battery cells, in particular lithium-ion cells, but also with other battery cells comprising different cell chemistries which comprise an SEI formation. Exemplarily, these may be cells having silicon as an anode material, instead of a graphite material. In particular, embodiments described before may be used for formation while manufacturing battery cells.

Although some aspects have been described in the context of a device, it is clear that these aspects also represent a description of the corresponding method, such that a block or element of a device also corresponds to a respective method step or a feature of a method step. Analogously, aspects described in the context of or as a method step also represent a description of a corresponding block or item or feature of a corresponding device.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable. Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine-readable carrier.

Other embodiments comprise the computer program for performing one of the methods described herein, wherein the computer program is stored on a machine-readable carrier.

In other words, an embodiment of the inventive method is, therefore, a computer program comprising a program code for performing one of the methods described herein, when the computer program runs on a computer. A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured or adapted to perform one of the methods described herein.

A further embodiment comprises a computer having installed thereon the computer program for performing one of the methods described herein.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods may be performed by any hardware apparatus. This can be a universally applicable hardware, such as a computer processor (CPU) or hardware specific for the method, such as ASIC.

The controllable energy source may also be controlled or implemented such that the amount of energy established is conducted to the battery to be formed by current pulses or a wavy current. Adaptation of the amount of energy, as has been described in the embodiments, may then be done by varying the frequency or the current impulse intensity or amplitude quantity.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

[1] He, Effects of Temperature on the Formation of Graphite-LiCoO2 Batteries 2008
[2] He, Effects of current densities on the formation of LiCoO2graphite LIB, 2011
[3] Lee, A fast formation process for lithium batteries, 2004

The invention claimed is:

1. A method for determining a reference energy profile, comprising:
    comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;
    determining a deviation between the first and the second course for each of the plurality of time intervals; and
    determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals.

2. The method in accordance with claim 1, wherein determining the amount of the electrical quantity takes place based on a conversion function comprising at least one function argument, the function argument being the deviation determined, wherein the electrical quantity describes an electrical current intensity or an amount of electrical charge.

3. The method in accordance with claim 2, wherein the conversion function is variable over the formation process.

4. A method for determining a reference energy profile, comprising:
    comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;
    determining a deviation between the first and the second course for each of the plurality of time intervals; and
    determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity;
    wherein a course of the amount of the electrical quantity over the plurality of time intervals describes the reference energy profile at least partly.

5. The method in accordance with claim 4, further comprising:
    determining an extent of the formation caused by the electrical quantity fed when compared to the formation causable by the electrical quantity, using the deviation and using a measurement at a reference battery or a simulation for a corresponding battery type.

6. The method in accordance with claim 1, wherein comparing the first and the second course further comprises:
    determining an amount of charge absorbed or released by the first or second battery, for each of the plurality of time intervals;
    establishing a ratio between the amount of charge absorbed and a change in voltage, which describes a change in an electrical voltage applied to battery poles of the first battery, for each of the plurality of time intervals; or
    establishing a ratio between the amount of charge absorbed and a change in voltage, which describes a change in an electrical voltage applied to battery poles of the second battery, for each of the plurality of time intervals.

7. The method in accordance with claim 4, wherein comparing the first and the second course further comprises:
    determining an amount of charge absorbed or released by the first or second battery, for each of the plurality of time intervals;
    establishing a ratio between the amount of charge absorbed and a change in voltage, which describes a change in an electrical voltage applied to battery poles of the first battery, for each of the plurality of time intervals; or
    establishing a ratio between the amount of charge absorbed and a change in voltage, which describes a change in an electrical voltage applied to battery poles of the second battery, for each of the plurality of time intervals.

8. The method in accordance with claim 1, wherein determining the deviation comprises calculating a quotient or calculating a difference between values of the first and the second course.

9. The method in accordance with claim 4, wherein determining the deviation comprises calculating a quotient or calculating a difference between values of the first and the second course.

10. The method in accordance with claim 1, wherein the first charge cycle is the temporally first charge cycle during which the first battery is charged, and wherein discharge of the first battery follows after the first charge cycle, and wherein the second charge cycle follows after the discharge.

11. The method in accordance with claim 4, wherein the first charge cycle is the temporally first charge cycle during which the first battery is charged, and wherein discharge of the first battery follows after the first charge cycle, and wherein the second charge cycle follows after the discharge.

12. The method in accordance with claim 1, wherein the first course and/or the second course describe/s a mean value of a plurality of courses of charge cycles established for a plurality of batteries.

13. The method in accordance with claim 4, wherein the first course and/or the second course describe/s a mean value of a plurality of courses of charge cycles established for a plurality of batteries.

14. The method in accordance with claim 1, wherein the plurality of time intervals relates to a temporal duration of the first or second charge cycle and comprises a number of at least three time intervals per hour.

15. The method in accordance with claim 4, wherein the plurality of time intervals relates to a temporal duration of the first or second charge cycle and comprises a number of at least three time intervals per hour.

16. The method in accordance with claim 1, wherein a temporal duration of at least one of the plurality of time intervals correlates with a time span within which an electrical voltage applied to the first or second battery is unchanged within a tolerance range of at least 0.1% and at most 30%.

17. The method in accordance with claim 4, wherein a temporal duration of at least one of the plurality of time intervals correlates with a time span within which an electrical voltage applied to the first or second battery is unchanged within a tolerance range of at least 0.1% and at most 30%.

18. The method in accordance with claim 1, wherein the first or the second course is acquired by a computer simulation of the charge or discharge process of the first or second battery.

19. The method in accordance with claim 4, wherein the first or the second course is acquired by a computer simulation of the charge or discharge process of the first or second battery.

20. The method in accordance with claim 1, wherein the method is performed repeatedly in at least one repetition, wherein the first course and the second course of a respective repetition are associated to a charge or discharge cycle of the battery to be formed, and wherein the first course and the second course of a repetition are changed when compared to the first course and to the second course, respectively, of a previous execution of the method, and wherein a respective reference current profile is established for repeated charge or discharge cycles of the battery.

21. The method in accordance with claim 4, wherein the method is performed repeatedly in at least one repetition, wherein the first course and the second course of a respective repetition are associated to a charge or discharge cycle of the battery to be formed, and wherein the first course and the second course of a repetition are changed when compared to the first course and to the second course, respectively, of a previous execution of the method, and wherein a respective reference current profile is established for repeated charge or discharge cycles of the battery.

22. The method in accordance with claim 1, further comprising:

determining an auxiliary quantity for the first or second battery in at least one of the time intervals and storing the auxiliary quantity determined in the reference energy profile.

23. The method in accordance with claim 4, further comprising:

determining an auxiliary quantity for the first or second battery in at least one of the time intervals and storing the auxiliary quantity determined in the reference energy profile.

24. A method for forming a battery, comprising:

acquiring a reference energy profile for forming the battery comprising:

comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;

determining a deviation between the first and the second course for each of the plurality of time intervals; and determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals; and charging the battery by an amount of an electrical quantity, wherein a temporal course of the amount of the electrical quantity is based on the reference energy profile.

25. The method in accordance with claim 24, wherein determining the amount of the electrical quantity takes place based on a conversion function comprising at least one function argument, the function argument being the deviation determined, wherein the electrical quantity describes an electrical current intensity or an amount of electrical charge.

26. The method in accordance with claim 25, wherein the conversion function is variable over the formation process.

27. A method for forming a battery, comprising:

acquiring a reference energy profile for forming the battery comprising:

comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;

determining a deviation between the first and the second course for each of the plurality of time intervals; and determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity;

wherein a course of the amount of the electrical quantity over the plurality of time intervals describes the reference energy profile at least partly; and charging the battery by an amount of an electrical quantity, wherein a temporal course of the amount of the electrical quantity is based on the reference energy profile.

28. The method in accordance with claim 27, further comprising:

determining an extent of the formation caused by the electrical quantity fed when compared to a formation causable by the electrical quantity, using the deviation and using a measurement at a reference battery or a simulation for a corresponding battery type.

29. The method in accordance with claim 24, wherein comparing the first and the second course further comprises:
determining an amount of charge absorbed or released by the first or second battery, for each of the plurality of time intervals;
establishing a ratio between the amount of charge absorbed and a change in voltage, which describes a change in an electrical voltage applied to battery poles of the first battery, for each of the plurality of time intervals; or
establishing a ratio between the amount of charge absorbed and a change in voltage, which describes a change in an electrical voltage applied to battery poles of the second battery, for each of the plurality of time intervals.

30. The method in accordance with claim 27, wherein comparing the first and the second course further comprises:
determining an amount of charge absorbed or released by the first or second battery, for each of the plurality of time intervals;
establishing a ratio between the amount of charge absorbed and a change in voltage, which describes a change in an electrical voltage applied to battery poles of the first battery, for each of the plurality of time intervals; or
establishing a ratio between the amount of charge absorbed and a change in voltage, which describes a change in an electrical voltage applied to battery poles of the second battery, for each of the plurality of time intervals.

31. The method in accordance with claim 24, wherein determining the deviation comprises calculating a quotient or calculating a difference between values of the first and the second course.

32. The method in accordance with claim 27, wherein determining the deviation comprises calculating a quotient or calculating a difference between values of the first and the second course.

33. The method in accordance with claim 24, wherein the first charge cycle is the temporally first charge cycle during which the first battery is charged, and wherein discharge of the first battery follows after the first charge cycle, and wherein the second charge cycle follows after the discharge.

34. The method in accordance with claim 27, wherein the first charge cycle is the temporally first charge cycle during which the first battery is charged, and wherein discharge of the first battery follows after the first charge cycle, and wherein the second charge cycle follows after the discharge.

35. The method in accordance with claim 24, wherein the first course and/or the second course describe/s a mean value of a plurality of courses of charge cycles established for a plurality of batteries.

36. The method in accordance with claim 27, wherein the first course and/or the second course describe/s a mean value of a plurality of courses of charge cycles established for a plurality of batteries.

37. The method in accordance with claim 24, wherein the plurality of time intervals relates to a temporal duration of the first or second charge cycle and comprises a number of at least three time intervals per hour.

38. The method in accordance with claim 27, wherein the plurality of time intervals relates to a temporal duration of the first or second charge cycle and comprises a number of at least three time intervals per hour.

39. The method in accordance with claim 24, wherein a temporal duration of at least one of the plurality of time intervals correlates with a time span within which an electrical voltage applied to the first or second battery is unchanged within a tolerance range of at least 0.1% and at most 30%.

40. The method in accordance with claim 27, wherein a temporal duration of at least one of the plurality of time intervals correlates with a time span within which an electrical voltage applied to the first or second battery is unchanged within a tolerance range of at least 0.1% and at most 30%.

41. The method in accordance with claim 24, wherein the first or the second course is acquired by a computer simulation of the charge or discharge process of the first or second battery.

42. The method in accordance with claim 27, wherein the first or the second course is acquired by a computer simulation of the charge or discharge process of the first or second battery.

43. The method in accordance with claim 24, wherein the method is performed repeatedly in at least one repetition, wherein the first course and the second course of a respective repetition are associated to a charge or discharge cycle of the battery to be formed, and wherein the first course or the second course of a repetition are changed when compared to the first course and to the second course, respectively, of a previous execution of the method, and wherein a respective reference current profile is established for repeated charge or discharge cycles of the battery.

44. The method in accordance with claim 27, wherein the method is performed repeatedly in at least one repetition, wherein the first course and the second course of a respective repetition are associated to a charge or discharge cycle of the battery to be formed, and wherein the first course or the second course of a repetition are changed when compared to the first course and to the second course, respectively, of a previous execution of the method, and wherein a respective reference current profile is established for repeated charge or discharge cycles of the battery.

45. The method in accordance with claim 24, further comprising:
determining an auxiliary quantity for the first or second battery in at least one of the time intervals and storing the auxiliary quantity determined in the reference energy profile.

46. The method in accordance with claim 27, further comprising:
determining an auxiliary quantity for the first or second battery in at least one of the time intervals and storing the auxiliary quantity determined in the reference energy profile.

47. The method in accordance with claim 24, wherein the temporal course comprises a plurality of time intervals which correlate with a time span within which an electrical voltage applied to the first or second battery is unchanged within a tolerance range of at least 0.1% and at most 30%.

48. The method in accordance with claim 27, wherein the temporal course comprises a plurality of time intervals which correlate with a time span within which an electrical voltage applied to the first or second battery is unchanged within a tolerance range of at least 0.1% and at most 30%.

49. The method in accordance with claim 24, further comprising:

determining a first physical quantity of the battery at a first point in time;

interrupting charging the battery and determining the first physical quantity of the battery at a second point in time which follows after the first point in time;

determining a deviation between the first physical quantity at the first point in time and the first physical quantity at the second point in time;

correcting the reference energy profile based on the deviation determined; and resuming charging or discharging.

50. The method in accordance with claim 27, further comprising:

determining a first physical quantity of the battery at a first point in time;

interrupting charging the battery and determining the first physical quantity of the battery at a second point in time which follows after the first point in time;

determining a deviation between the first physical quantity at the first point in time and the first physical quantity at the second point in time;

correcting the reference energy profile based on the deviation determined; and resuming charging or discharging.

51. The method in accordance with claim 49, wherein the amount of the electrical quantity relates to an electrical quantity to be provided to the battery in dependence on an electrical voltage applied to battery poles of the battery, wherein the first physical state is the electrical voltage applied to battery poles of the battery, and wherein correcting the reference energy profile takes place based on the deviation determined.

52. The method in accordance with claim 50, wherein the amount of the electrical quantity relates to an electrical quantity to be provided to the battery in dependence on an electrical voltage applied to battery poles of the battery, wherein the first physical state is the electrical voltage applied to battery poles of the battery, and wherein correcting the reference energy profile takes place based on the deviation determined.

53. The method in accordance with claim 49, wherein the amount of the electrical quantity refers to a value of an electrical quantity to be provided to the battery in dependence on an electrical voltage applied to battery poles of the battery, and wherein the reference energy profile additionally comprises information on an auxiliary quantity of a reference battery in dependence on the voltage applied to the battery poles; and which further comprises:

determining an auxiliary quantity for the battery based on the deviation and based on the electrical quantity provided to the battery with a first value before the interruption; and determining a correction value for the reference energy profile based on the auxiliary quantity and based on a second value of the electrical quantity provided to the battery applied after resuming; and correcting the reference energy profile based on the correction value determined.

54. The method in accordance with claim 50, wherein the amount of the electrical quantity refers to a value of an electrical quantity to be provided to the battery in dependence on an electrical voltage applied to battery poles of the battery, and wherein the reference energy profile additionally comprises information on an auxiliary quantity of a reference battery in dependence on the voltage applied to the battery poles; and which further comprises:

determining an auxiliary quantity for the battery based on the deviation and based on the electrical quantity provided to the battery with a first value before the interruption; and determining a correction value for the reference energy profile based on the auxiliary quantity and based on a second value of the electrical quantity provided to the battery applied after resuming; and correcting the reference energy profile based on the correction value determined.

55. The method in accordance with claim 49, wherein the first physical quantity of the battery at the second point in time is an open-circuit voltage of the battery.

56. The method in accordance with claim 50, wherein the first physical quantity of the battery at the second point in time is an open-circuit voltage of the battery.

57. The method in accordance with claim 1, wherein the reference energy profile comprises information relating to an electrical energy to be provided by a controllable energy source for forming a battery to be formed, wherein the information relating to the electrical energy to be provided by the controllable energy source are information on the energy itself, an electrical current intensity, an amount of electrical charge or an electrical voltage, resulting in charging or discharging of the battery to be formed.

58. The method in accordance with claim 1, wherein the amount of the electrical quantity is an electrical current intensity and/or an amount of electrical charge and/or an electrical voltage, resulting in charging or discharging of the battery to be formed.

59. A non-transitory digital storage medium having stored thereon a computer program for performing a method for determining a reference energy profile, comprising:

comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;

determining a deviation between the first and the second course for each of the plurality of time intervals; and determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals, when said computer program runs on a computer.

60. A non-transitory digital storage medium having stored thereon a computer program for performing a method for determining a reference energy profile, comprising:

comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;

determining a deviation between the first and the second course for each of the plurality of time intervals; and determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity;
wherein a course of the amount of the electrical quantity over the plurality of time intervals describes the reference energy profile at least partly,
when said computer program runs on a computer.

61. A non-transitory digital storage medium having stored thereon a computer program for performing a method for forming a battery, comprising:
acquiring a reference energy profile for forming the battery comprising:
comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;
determining a deviation between the first and the second course for each of the plurality of time intervals; and
determining an amount of the electrical quantity based on the deviation for each of the time intervals, wherein the amount of the electrical quantity describes a preset default value of the reference energy profile for an amount of the electrical quantity to be fed to a battery to be formed during a formation process of the battery to be formed, for each of the time intervals; and
charging the battery by an amount of an electrical quantity, wherein a temporal course of the amount of the electrical quantity is based on the reference energy profile,
when said computer program runs on a computer.

62. A non-transitory digital storage medium having stored thereon a computer program for performing a method for forming a battery, comprising:
acquiring a reference energy profile for forming the battery comprising:
comparing a first course which describes an absorption of an electrical quantity of a first battery during a first charge cycle, to a second course which describes the absorption of the electrical quantity of the first or a second battery during a second charge cycle which follows after the first charge cycle, for a plurality of time intervals;
determining a deviation between the first and the second course for each of the plurality of time intervals; and
determining that an amount of the electrical quantity fed to another battery during formation thereof is reduced in a time interval, based on the comparison when the comparison indicates that an extent of a formation caused by the electrical quantity is greater than or equaling 40% of a formation causable by the electrical quantity;
wherein a course of the amount of the electrical quantity over the plurality of time intervals describes the reference energy profile at least partly; and
charging the battery by an amount of an electrical quantity, wherein a temporal course of the amount of the electrical quantity is based on the reference energy profile,
when said computer program runs on a computer.

63. Usage of a reference energy profile having been established using a method in accordance with claim 1 in order to apply the electrical quantity to the battery to be formed based on the reference energy profile.

64. A device for forming a battery, comprising:
a controllable energy source configured to provide an electrical quantity to a battery coupled to the controllable energy source in order to form the battery;
a controller configured to control the controllable energy source in a plurality of time intervals in order to form the battery during the plurality of time intervals;
a detector configured to determine a physical state of the battery in each of the time intervals,
wherein the controller is configured to control the controllable energy source based on the physical state detected such that an amount of the electrical quantity provided to the battery during a subsequent time interval is increased or decreased.

65. The device in accordance with claim 64, wherein the physical state relates to at least one of an electrical voltage applied to battery poles of the battery, an electrical current intensity guided to the battery, an amount of electrical charge absorbed by the battery, a duration during which electrical quantity is absorbed by the battery, and a temperature applied at or in the battery.

66. The device in accordance with claim 64, wherein the controller is configured to associate a value of the physical state detected to an energy quantity and to control the controllable energy source such that the controllable energy source provides the energy quantity determined to the battery within a subsequent time interval.

67. The device in accordance with claim 64;
wherein the device comprises a memory configured to store a reference energy profile comprising a preset default value for each of the plurality of time intervals of a charge cycle for the electrical quantity to be provided to the battery and the physical state;
wherein the controller is configured to control the controllable energy source such that the same charges the battery based on the preset default values of electrical quantity;
wherein the controller is configured to determine a deviation between a physical state of the battery determined and the preset default value of the physical state for each of the plurality of time intervals;
wherein the controller is configured to control the controllable energy source in a manner deviating from the preset default value for the electrical quantity such that the battery is charged with a lower or higher measure of the electrical quantity when the deviation between the preset default value of the physical state and the physical state detected is greater than at least 1%.

68. The device in accordance with claim 64, wherein the physical state relates at least partly to a change in voltage of the electrical voltage applied to battery poles of the battery in relation to an amount of charge absorbed by the battery.

69. A method for forming a battery, comprising:
providing an electrical quantity, by a controllable energy source, to a battery coupled to the controllable energy source in order to form the battery;
controlling the controllable energy source in a plurality of time intervals in order to form the battery during the plurality of time intervals;
determining a physical state of the battery in each of the time intervals;
wherein the controllable energy source is controlled based on the physical state determined such that an amount of the electrical quantity provided to the battery during a subsequent time interval is increased or decreased.

70. The method in accordance with claim 69, further comprising:
- determining a first physical quantity of the battery at a first point in time;
- interrupting providing the electrical quantity to the battery and determining the first physical quantity of the battery at a second point in time which follows after the first point in time;
- determining a deviation between the first physical quantity at the first point in time and the first physical quantity at the second point in time;
- correcting the amount of the electrical quantity to be provided to the battery based on the deviation determined; and
- resuming charging or discharging based on the corrected amount of the electrical quantity.

71. The method in accordance with claim 69, wherein the amount of the electrical quantity to be provided is related to an electrical quantity to be provided to the battery in dependence on an electrical voltage applied to battery poles of the battery, wherein the first physical state is the electrical voltage applied to battery poles of the battery.

72. The method in accordance with claim 70, wherein the amount of the electrical quantity to be provided relates to a value of an electrical quantity to be provided to the battery in dependence on an electrical voltage applied to battery poles of the battery, and which further comprises:
- determining an auxiliary quantity for the battery based on the deviation and based on the electrical quantity provided to the battery with a first value before the interruption; and
- determining a correction value for the amount of the electrical quantity based on the auxiliary quantity and based on a second value of the electrical quantity provided to the battery applied after resuming; and
- correcting the amount of the electrical quantity based on the correction value determined.

73. A method for determining a reference current profile which comprises information relating to a current to be provided by a controllable energy source for a formation of a battery to be formed, comprising:
- comparing a first course which describes a change in voltage with the charge of a first battery during a first charge cycle, to a second course which describes the change in voltage with the charge of the first or a second battery during a second charge cycle which follows after the first charge cycle, for a plurality of time intervals of the courses;
- determining a deviation between the first and the second course for each of the plurality of time intervals; and
- determining an electrical current based on the deviation for each of the time intervals, wherein the electrical current describes a preset default value of the reference energy profile for an amount of current to be fed to the battery to be formed by the controllable energy source during a formation process of the battery to be formed for each of the time intervals.

74. The method in accordance with claim 73, wherein comparing the first and second course further comprise:
- determining an amount of charge absorbed or released by the first or second battery, for each of the plurality of time intervals, wherein a positive amount of the electrical quantity results in charging the first or second battery, and wherein a negative amount of the electrical quantity results in discharging the first or second battery;
- establishing, for each of the plurality of time intervals,
- a ratio between the amount of charge absorbed and a change in voltage which describes a change in an electrical voltage applied to battery poles of the first battery; or
- a ratio between the amount of charge absorbed and a change in voltage which describes a change in an electrical voltage applied to battery poles of the second battery.

75. A method for correcting a reference energy profile, comprising:
- charging or discharging a battery to be formed with the reference energy profile which comprises information on a value of an electrical quantity to be provided to the battery;
- determining a first physical quantity of the battery at a first point in time;
- interrupting charging or discharging the battery and determining the first physical quantity of the battery at a second point in time which follows after the first point in time;
- determining a deviation between the first physical quantity at the first point in time and the first physical quantity at the second point in time;
- correcting the reference energy profile based on the deviation determined; and
- resuming charging or discharging.

76. The method in accordance with claim 75, wherein the reference energy profile comprises the information on the value of the electrical quantity to be provided to the battery in dependence on an electrical voltage applied to battery poles of the battery, wherein the first physical state is the electrical voltage applied to battery poles of the battery, and wherein correcting the reference energy profile takes place based on the deviation determined.

77. The method in accordance with claim 75, further comprising:
- determining an auxiliary quantity for the battery based on the deviation and based on the electrical quantity provided to the battery with a first value before the interruption;
- determining a correction value for the reference energy profile based on the auxiliary quantity and based on a second value of the electrical quantity provided to the battery applied after resuming; and
- correcting the reference energy profile based on the correction value determined.

78. The method in accordance with claim 75, wherein the first physical quantity of the battery at the second point in time is an open-circuit voltage of the battery.

* * * * *